United States Patent
Isobe et al.

(10) Patent No.: US 7,449,376 B2
(45) Date of Patent: Nov. 11, 2008

(54) METHOD OF MANUFACTURING A SEMICONDUCTOR DEVICE

(75) Inventors: Atsuo Isobe, Atsugi (JP); Tatsuya Arao, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 44 days.

(21) Appl. No.: 11/120,992

(22) Filed: May 4, 2005

(65) Prior Publication Data

US 2005/0208710 A1    Sep. 22, 2005

Related U.S. Application Data

(62) Division of application No. 10/305,264, filed on Nov. 27, 2002, now Pat. No. 6,890,840.

(30) Foreign Application Priority Data

Nov. 28, 2001   (JP) .............................. 2001-363486

(51) Int. Cl.
    *H01L 21/84*    (2006.01)
(52) U.S. Cl. ................. 438/166; 257/E21.561
(58) Field of Classification Search ......... 438/151–166; 257/E21.561
    See application file for complete search history.

(56) References Cited

U.S. PATENT DOCUMENTS

| 4,341,569 A | 7/1982 | Yaron et al. |
| 4,571,486 A | 2/1986 | Arai et al. |
| 4,651,182 A | 3/1987 | Yamazaki |
| 4,727,044 A | 2/1988 | Yamazaki |
| 4,746,628 A | 5/1988 | Takafuji et al. |
| 4,762,807 A | 8/1988 | Yamazaki |

(Continued)

FOREIGN PATENT DOCUMENTS

EP    0 862 201    9/1998

(Continued)

OTHER PUBLICATIONS

Y. Kawazu, H. Kudo, S. Onari, T. Arai, Low-Temperature Crystallization of Hydrogenated Amorphous Silicon Induced by Nickel Silicide Formation, *Japanese Journal of Applied Physics*, vol. 29, pp. 2698-2704, Dec. 1990.

(Continued)

*Primary Examiner*—Richard A. Booth
(74) *Attorney, Agent, or Firm*—Eric J. Robinson; Robinson Intellectual Property Law Office, P.C.

(57) ABSTRACT

An object of the present invention is to form a channel formation region, or a TFT formation region, using one crystal aggregate (domain) by controlling crystal location and size, thus suppressing TFT variations. According to the present invention, laser irradiation is performed selectively on an amorphous silicon film in the periphery of a channel formation region, or the periphery of a TFT formation region containing a channel formation region, source and drain region, and the like. Each TFT formation region is isolated, a metallic element for promoting crystallization (typically Ni) is added, and heat treatment is performed, thus making it possible to arbitrarily determine the locations of crystal aggregates (domains). It becomes possible to suppress variations in the TFTs by arbitrarily controlling the crystal aggregate (domain) locations.

28 Claims, 13 Drawing Sheets

U.S. PATENT DOCUMENTS

| | | | |
|---|---|---|---|
| 4,772,927 A | 9/1988 | Saito et al. | |
| 4,986,213 A | 1/1991 | Yamazaki et al. | |
| 5,091,334 A | 2/1992 | Yamazaki et al. | |
| 5,147,826 A | 9/1992 | Liu et al. | |
| 5,156,994 A | 10/1992 | Moslehi | |
| 5,236,850 A | 8/1993 | Zhang | |
| 5,252,502 A | 10/1993 | Havemann | |
| 5,275,851 A | 1/1994 | Fonash et al. | |
| 5,278,093 A | 1/1994 | Yonehara | |
| 5,308,998 A * | 5/1994 | Yamazaki et al. | 257/57 |
| 5,313,076 A | 5/1994 | Yamazaki et al. | |
| 5,328,861 A | 7/1994 | Miyakawa | |
| 5,352,291 A | 10/1994 | Zhang et al. | |
| 5,374,837 A | 12/1994 | Uno | |
| 5,396,084 A | 3/1995 | Matsumoto | |
| 5,403,772 A | 4/1995 | Zhang et al. | |
| 5,409,857 A | 4/1995 | Watanabe et al. | |
| 5,426,064 A | 6/1995 | Zhang et al. | |
| 5,481,121 A | 1/1996 | Zhang et al. | |
| 5,488,000 A | 1/1996 | Zhang et al. | |
| 5,492,843 A | 2/1996 | Adachi et al. | |
| 5,501,989 A | 3/1996 | Takayama et al. | |
| 5,508,533 A | 4/1996 | Takemura | |
| 5,529,937 A | 6/1996 | Zhang et al. | |
| 5,531,182 A | 7/1996 | Yonehara | |
| 5,534,716 A | 7/1996 | Takemura | |
| 5,543,352 A | 8/1996 | Ohtani et al. | |
| 5,563,426 A | 10/1996 | Zhang et al. | |
| 5,569,610 A * | 10/1996 | Zhang et al. | 438/166 |
| 5,569,936 A | 10/1996 | Zhang et al. | |
| 5,580,792 A | 12/1996 | Zhang et al. | |
| 5,585,291 A | 12/1996 | Ohtani et al. | |
| 5,589,694 A | 12/1996 | Takayama et al. | |
| 5,595,923 A | 1/1997 | Zhang et al. | |
| 5,595,944 A | 1/1997 | Zhang et al. | |
| 5,604,360 A | 2/1997 | Zhang et al. | |
| 5,605,846 A | 2/1997 | Ohtani et al. | |
| 5,606,179 A | 2/1997 | Yamazaki et al. | |
| 5,608,232 A | 3/1997 | Yamazaki et al. | |
| 5,612,250 A | 3/1997 | Ohtani et al. | |
| 5,614,426 A | 3/1997 | Funada et al. | |
| 5,614,733 A | 3/1997 | Zhang et al. | |
| 5,616,506 A | 4/1997 | Takemura | |
| 5,620,910 A | 4/1997 | Teramoto | |
| 5,621,224 A | 4/1997 | Yamazaki et al. | |
| 5,624,851 A | 4/1997 | Takayama et al. | |
| 5,637,515 A | 6/1997 | Takemura | |
| 5,639,698 A | 6/1997 | Yamazaki et al. | |
| 5,643,826 A | 7/1997 | Ohtani et al. | |
| 5,646,424 A | 7/1997 | Zhang et al. | |
| 5,654,203 A | 8/1997 | Ohtani et al. | |
| 5,656,825 A | 8/1997 | Kusumoto et al. | |
| 5,663,077 A | 9/1997 | Adachi et al. | |
| 5,677,549 A | 10/1997 | Takayama et al. | |
| 5,696,386 A | 12/1997 | Yamazaki | |
| 5,696,388 A | 12/1997 | Funada et al. | |
| 5,700,333 A | 12/1997 | Yamazaki et al. | |
| 5,705,829 A | 1/1998 | Miyanaga et al. | |
| 5,712,191 A | 1/1998 | Nakajima et al. | |
| 5,783,468 A | 7/1998 | Zhang et al. | |
| 5,869,363 A * | 2/1999 | Yamazaki et al. | 438/166 |
| 5,886,366 A | 3/1999 | Yamazaki et al. | |
| 6,162,704 A | 12/2000 | Yamazaki et al. | |
| 6,197,626 B1 | 3/2001 | Yamazaki et al. | |
| 6,355,509 B1 | 3/2002 | Yamazaki | |
| 6,448,118 B2 | 9/2002 | Yamazaki et al. | |
| 6,461,943 B1 | 10/2002 | Yamazaki et al. | |
| 6,893,503 B1 | 5/2005 | Ohnuma et al. | |
| 7,115,452 B2 | 10/2006 | Yamazaki et al. | |

FOREIGN PATENT DOCUMENTS

| | | |
|---|---|---|
| JP | 60-186066 | 9/1985 |
| JP | 63-056912 | 3/1988 |
| JP | 63-142807 | 6/1988 |
| JP | 02-208635 | 2/1989 |
| JP | 02-140915 | 5/1990 |
| JP | 02-140916 | 5/1990 |
| JP | 02-208635 | 8/1990 |
| JP | 02-222564 | 9/1990 |
| JP | 04-124813 | 4/1992 |
| JP | 05-034723 | 2/1993 |
| JP | 05-040278 | 2/1993 |
| JP | 06-318701 | 11/1994 |
| JP | 8-78329 | 3/1996 |
| JP | 10-214786 | 8/1998 |
| JP | 10-223533 | 8/1998 |
| JP | 10-242476 | 9/1998 |
| JP | 10-270363 | 10/1998 |

OTHER PUBLICATIONS

Y. Kawazu, H. Kudo, S. Onari, T. Arai, Initial Stage of the Interfacial Reaction between Nickel and Hydrogenated Amorphous Silicon, *Japanese Journal of Applied Physics*, vol. 29, pp. 729-738, Apr. 1990.

C. Hayzelden, J. L. Batstone, R. C. Cammarata, In Situ Transmission Electron Microscopy Studies of Silicide-Mediated Crystallization of Amorphous Silicon, *Applied Physics Letter*, vol. 60, No. 2, pp. 225-227, Jan. 13, 1992.

S. Caune, J. Marfaing, W. Marine, Combined CW Laser and Furnace Annealing of Amorphous Si and Ge In Contact With Some Metals, *Applied Surface Science*, vol. 36, pp. 597-604, 1989.

Sorab K. Ghandi, "Silicon and Gallinum Arsenide", *VLSI Fabrication Principles*, pp. 163-164, 1983.

Gang Liu and S. J. Fonash, "Selective Area Crystallization of Amorphous Silicon Films by Low-Temperature Rapid Thermal Annealing", *Applied Physics Letter*, vol. 55, No. 7, pp. 660-662, Aug. 1989.

R. Kakkad, G. Liu, S. J. Fonash, "Low Temperature Selective Crystallization of Amorphous Silicon", *Journal of Non-Crystalline Solids*, vol. 115, pp. 66-68, 1989.

R. Kakkad, J. Smith, W. S. Lau, S. J. Fonash, "Crystallized Si Films by Low-Temperature Rapid Thermal Annealing of Amorphous Silicon", *Journal of Applied Physics*, vol. 65, pp. 2069-2072, Mar. 1, 1989.

Gang Liu and Stephen J. Fonash, "Polycrystalline Silicon Thin Film Transistors on Corning 7059 Glass Substrates Using Short Time, Low-Temperature Processing", *Applied Physics Letter*, vol. 62, No. 20, pp. 2554-2556.

T. Hempel, et al, "Needle-Like Crystallization of Ni Doped Amorphous Silicon Thin Films", *Solid State Communications*, vol. 85, No. 11, pp. 921-924, 1993.

A. V. Dvurechenskii, et al, "Transport Phenomena in Amorphous Silicon Doped by Ion Implantation of 3D Metals", *Phys. Stat. Sol.*, vol. 95, pp. 635-640, 1986.

* cited by examiner

Fig.4C1 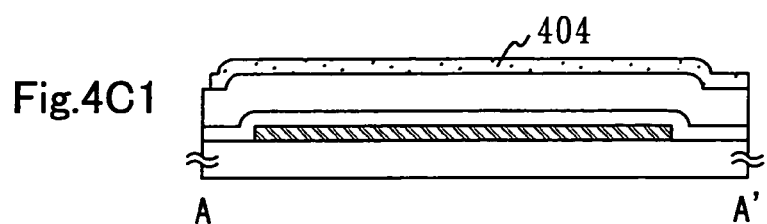
Fig.4C2 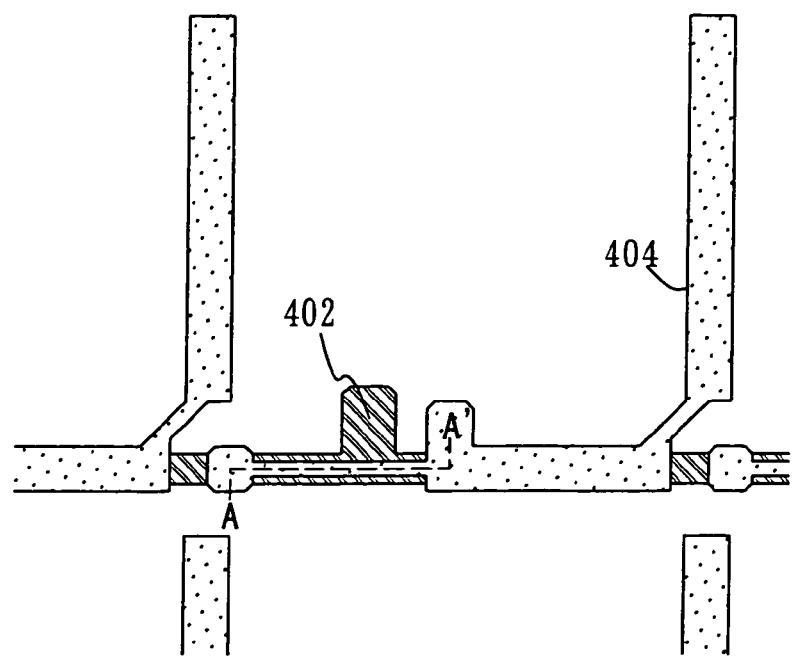

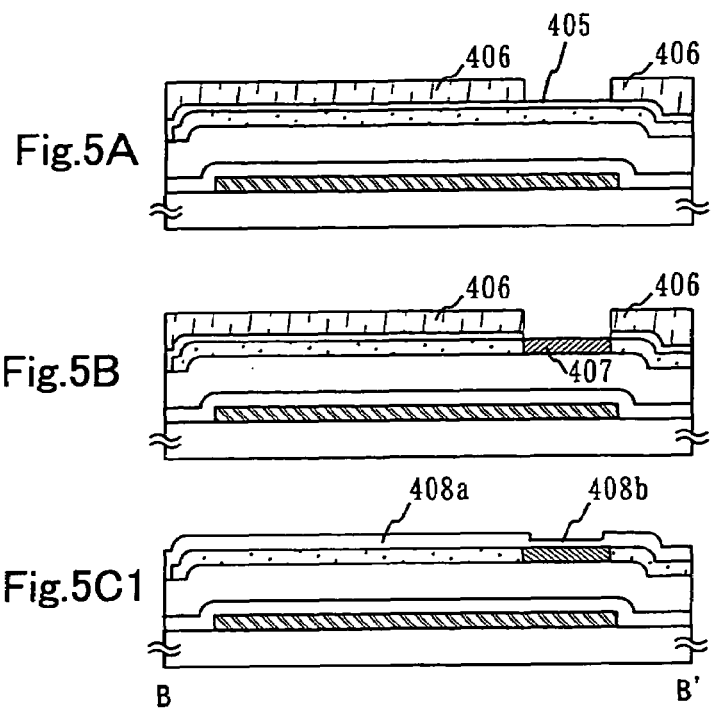
Fig.5A
Fig.5B
Fig.5C1
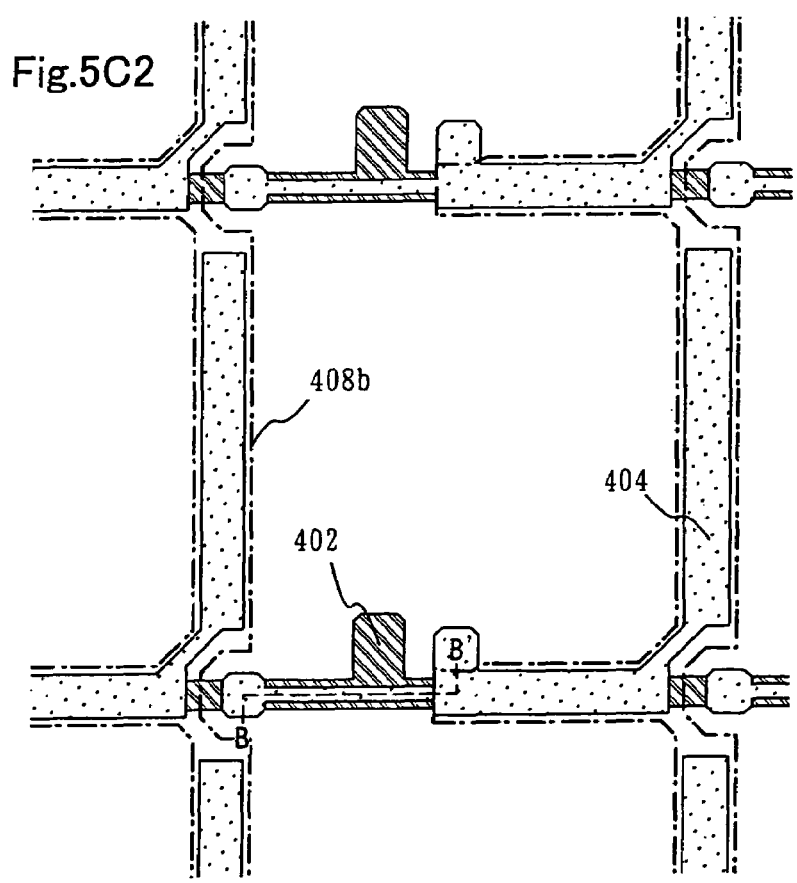
Fig.5C2

Fig. 6A
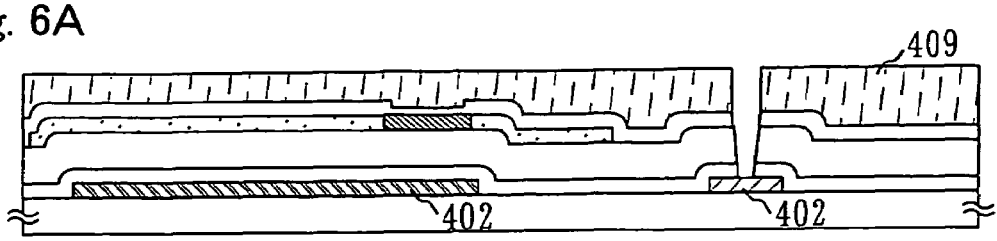
Fig. 6B
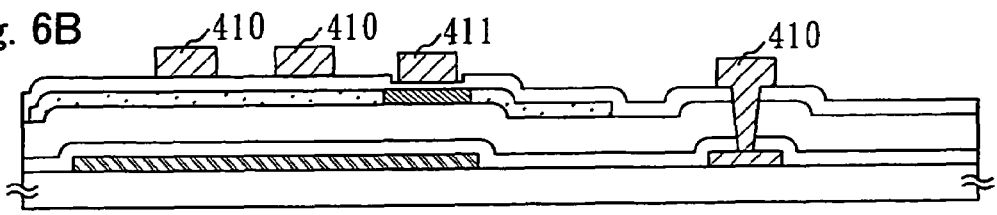
Fig. 6C1
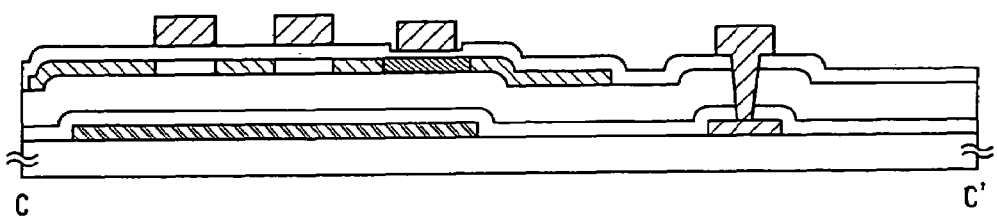
Fig. 6C2
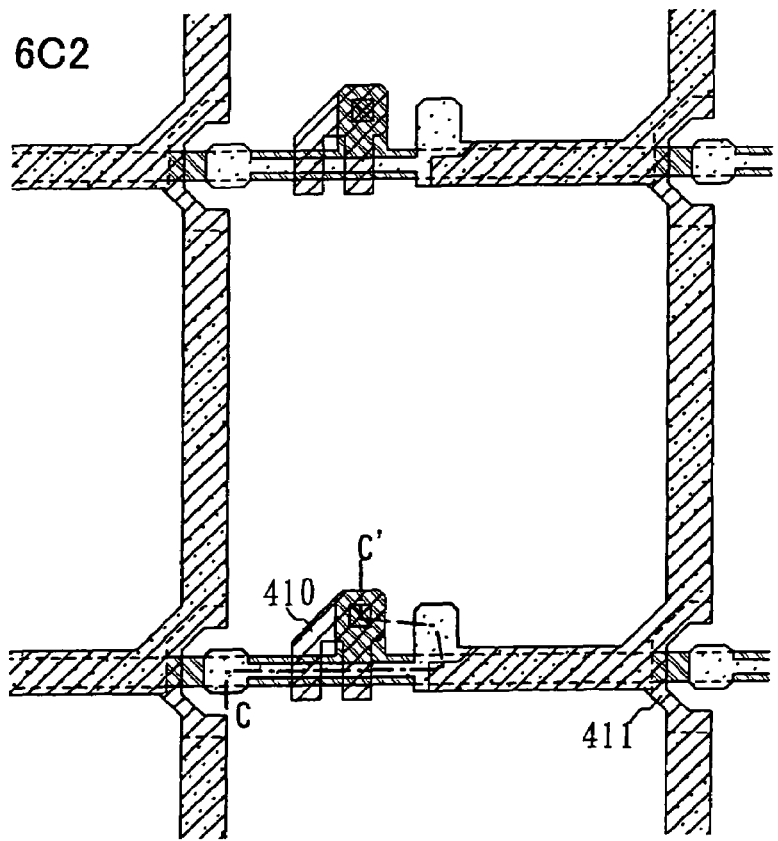

Fig. 7A
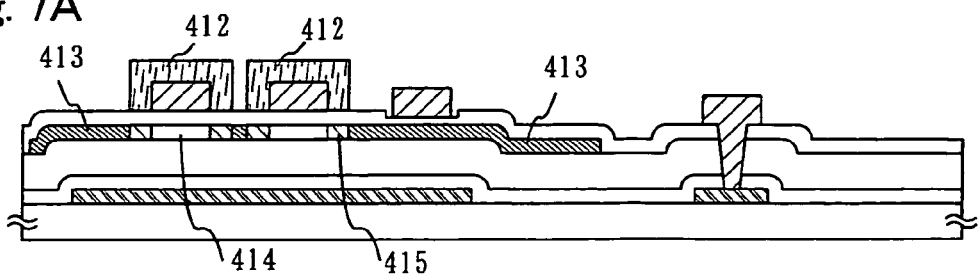
Fig. 7B1
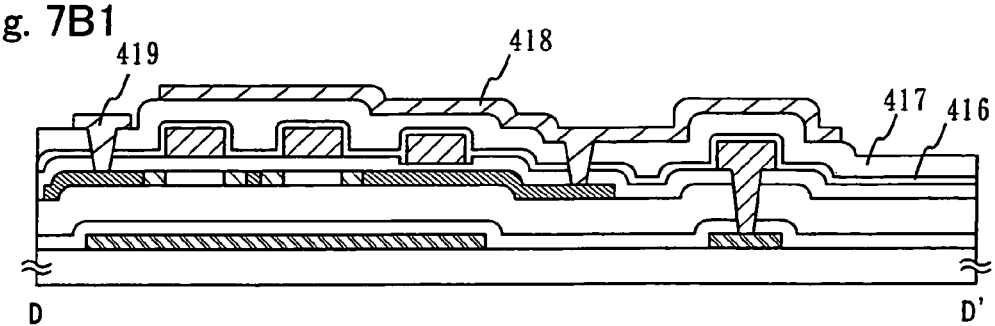
Fig. 7B2
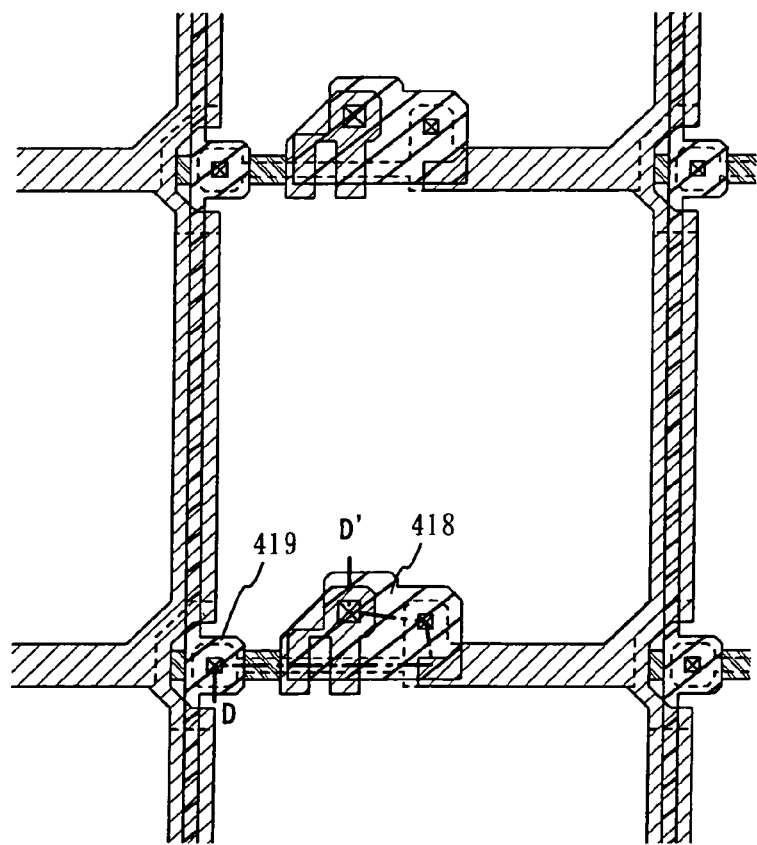

Fig.8A1
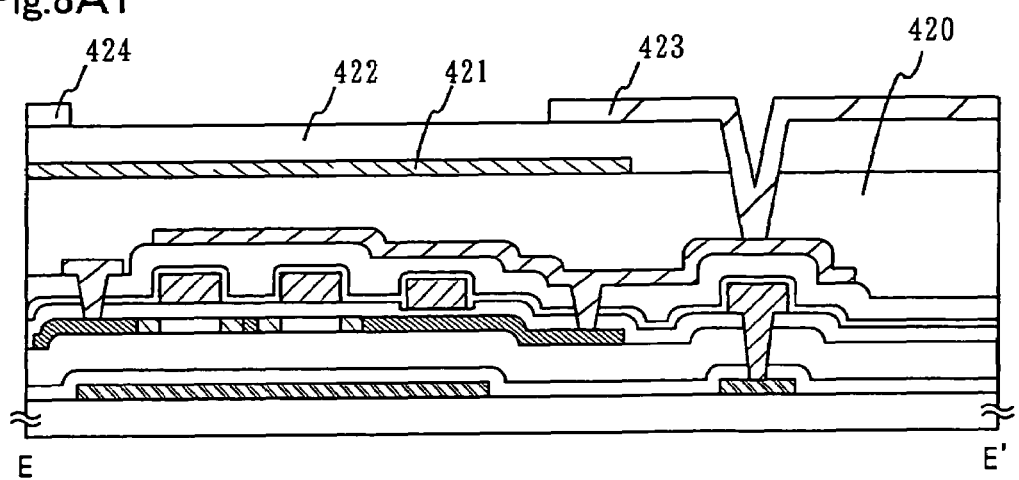
Fig. 8A2
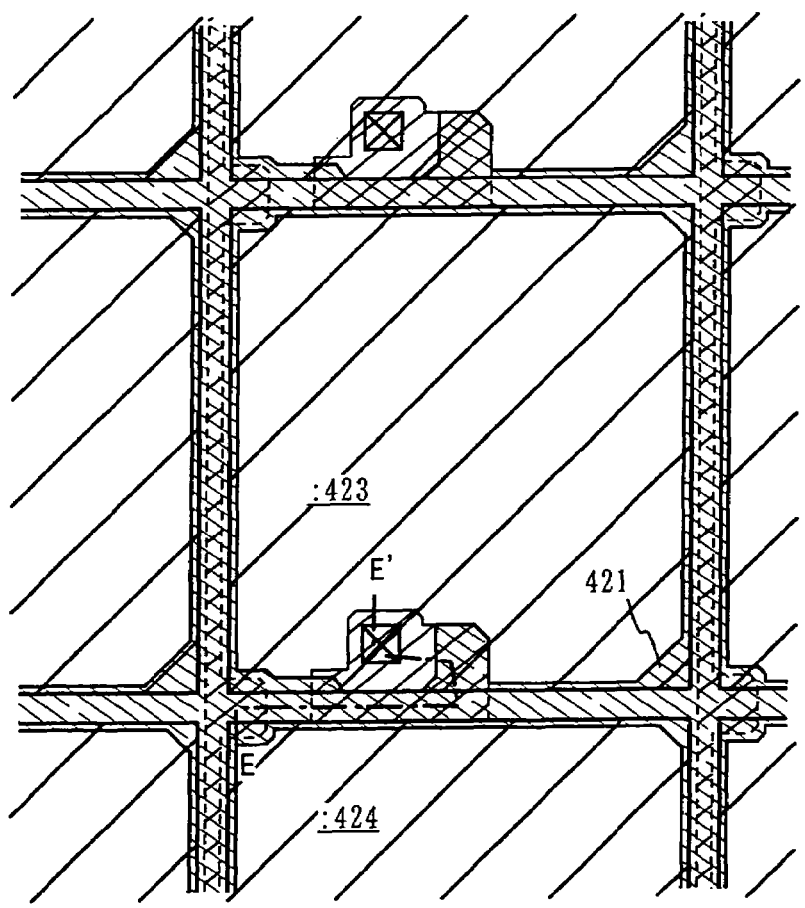

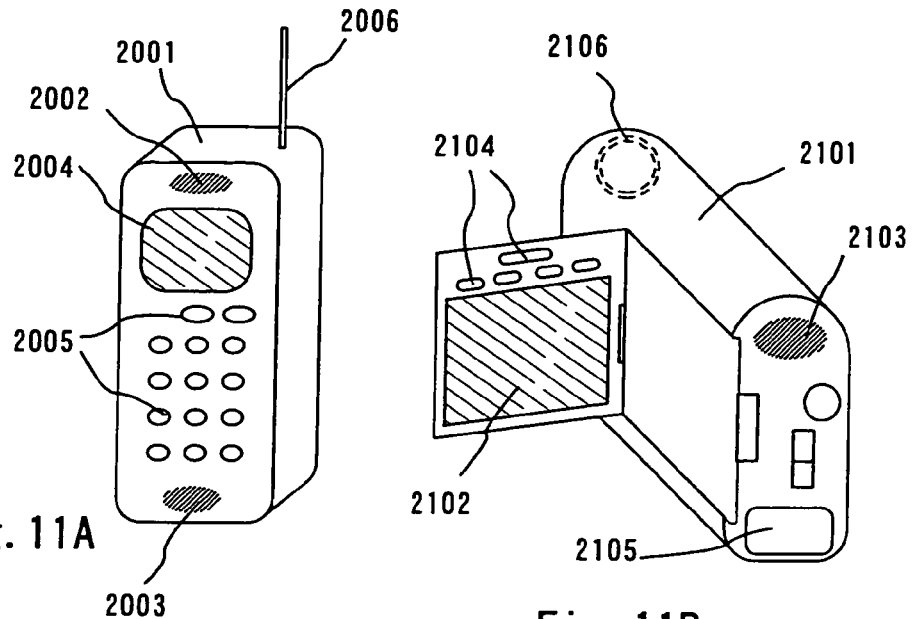
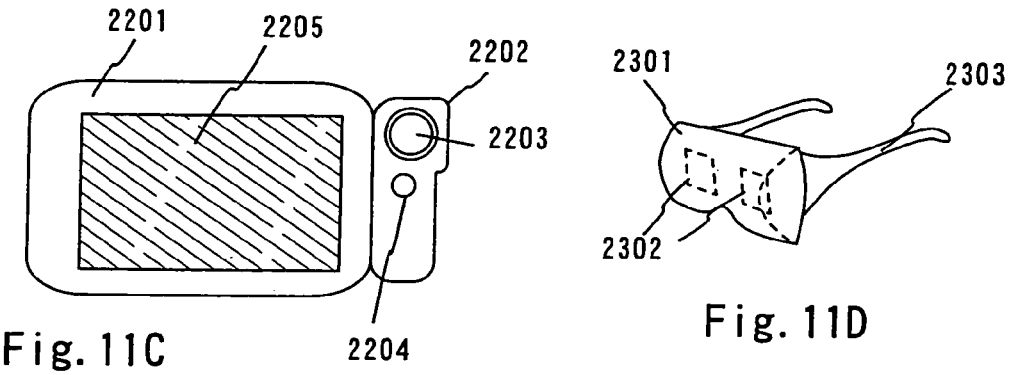
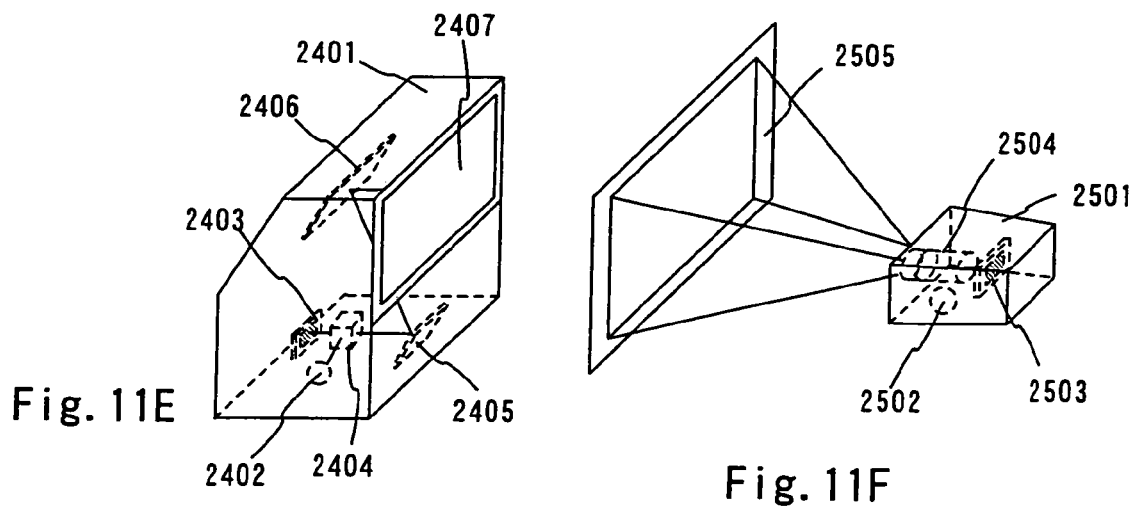

METHOD OF MANUFACTURING A SEMICONDUCTOR DEVICE

BACKGROUND OF THE INVENTION

1. Field of the Invention

The present invention relates to a method of manufacturing a semiconductor device having circuits structured by thin film transistors (hereinafter referred to as TFTs). In particular, the present invention relates to a technique of crystallizing a semiconductor film having an amorphous structure.

2. Description of the Related Art

Developments have been advancing recently in forming TFT active layers (indicating semiconductor regions that contain a source and drain region, and a channel formation region) by using semiconductor thin films formed on a substrate having an insulating surface, and applying the TFTs to semiconductor devices having large surface area integrated circuits.

A typical applied example of TFTs, which has been gathering attention, and is referred to as an active matrix liquid crystal display device, has pixel electrodes disposed on a matrix and TFTs applied to switching elements connected to each of the pixel electrodes.

In active matrix liquid crystal display devices, TFTs have been conventionally formed by using amorphous silicon films. However, attempts at manufacturing of TFTs (hereinafter referred to as polysilicon TFTs) which use crystalline silicon films (polysilicon films) in their active layers have been made in order to achieve higher performance. Polysilicon TFTs have high field effect mobility, and therefore it is possible to form circuits having various types of functions.

It is possible to form a pixel portion that performs image display per functional block, and a driver circuit portion for controlling the pixel portion and having shift register circuits, level shifter circuits, buffer circuits, sampling circuits, and the like based on CMOS circuits, on a single substrate for a liquid crystal module mounted in an active matrix liquid crystal display device using polysilicon TFTs.

A technique for manufacturing high quality crystalline silicon films is necessary in order to obtain polysilicon TFTs having good characteristics. Crystallization techniques, which use an excimer laser, are typical and widely known.

On the other hand, a technique disclosed in JP 8-78329 A is another technique for obtaining a crystalline silicon film on a glass substrate. The technique disclosed in JP 8-78329 A is one in which a metallic element for promoting crystallization (typically Ni) is selectively added to an amorphous silicon film, and a crystalline silicon film which spreads out from the metallic element added regions is formed by performing heat treatment. The size of crystal grains obtained is extremely large.

With the aforementioned known technique, it is possible to lower the crystallization temperature of the amorphous silicon film on the order of 50 to 100° C. compared to performing crystallization without using the metallic element. The amount of time necessary for crystallization can also be reduced to 1/10 to 1/5 compared to performing crystallization without using the metallic element, so that the technique also allows superior productivity.

Crystalline silicon films obtained by the technique of the aforementioned publication (JP 8-78329 A) have a unique crystal structure in which a multiple number of rod shape crystal aggregates (also referred to as domains) are formed, and all crystals in one crystal aggregate (domain) have the same crystal orientation. The size of the crystal aggregates (domains) is large at from 200 to 300 µm. Further, adjacent crystal aggregates (domains) have different orientations and have a boundary. Electrical characteristics being substantially the same as those of single crystal can be expected to be obtained provided that a channel formation region is formed within one of the crystal aggregates to form TFTs.

However, it is not possible to precisely control the position of the crystal aggregates with conventional techniques, including the technique of the above publication, and it is difficult to form channel formation regions with one crystal aggregate in accordance with the position of each TFT. That is, it is almost impossible to match the positions of the crystal aggregates and the positions of the channel formation regions for all TFTs used in forming the pixel portion and the driver circuit portion.

Crystalline silicon films obtained by the technique of the above publication (JP 8-78329 A) contain a metallic element for promoting crystallization (typically Ni). It is not preferable that a large amount of the metallic element exists within the crystalline silicon film because the metallic element inhibits the reliability and electrical stability of a device using the semiconductor. It is preferable to remove the metallic element quickly after crystallization of the amorphous silicon film, or to reduce its concentration to a level at which it does not exert influence on the electrical characteristics, by using a method referred to as gettering. Further, considering crystal growth mechanisms, a large portion of the metallic elements congregate in the boundaries of the crystal aggregations (domains).

Therefore, although a TFT will have good electrical characteristics if the crystalline silicon film is used for an active layer of the TFT, small differences among various other TFT characteristics will develop, in other words, variations, depending upon whether or not a boundary between adjacent crystal aggregates (crystal aggregates having different orientations) exists, and depending upon the difference in size of the crystal aggregates formed.

Variations will develop in the voltage applied to each pixel electrode if there are variations in the electrical characteristics of the TFTs disposed in the pixel portion, and variations will therefore also develop in the amount of light transmitted. This leads to display irregularities when viewed by observers. The variations are within a permissible range at present and of an order such that there arises no problems. However, pixel size is further made smaller, and the variations will become an extremely large problem for cases in which a very high fineness image is desired.

In the future, channel formation region size (channel length and channel width) is made smaller along with additional reductions in the design rule, and therefore if TFTs are formed having crystal aggregate boundaries in their channel formation regions, a difference will develop in the TFT characteristics (such as mobility, S-value, on current, and off current) compared to TFTs having channel formation regions with no crystal aggregate boundaries. This becomes a cause of a variation in display.

Further, although several experiments for forming crystalline silicon films having uniform grain size at a process temperature equal to or less than the distortion point of glass substrates, that is, at a temperature equal to or less than 600° C., have been proposed, at present a suitable means has not yet been uncovered.

Conventionally it has been difficult to obtain crystalline silicon films having both high uniformity and high mobility. In addition, it is difficult to manufacture at a process temperature equal to or less than 600° C.

SUMMARY OF THE INVENTION

In view of the aforementioned problems, an object of the present invention is to form a channel formation region, or a TFT formation region, using one crystal aggregate (domain) by controlling crystal position and size, thus suppressing TFT variations.

In order to resolve the above problems, according to the present invention, laser irradiation is performed selectively on an amorphous silicon film in the periphery of a channel formation region, or the periphery of a TFT formation region containing a channel formation region, source and drain region, and the like. Each TFT formation region is isolated, a metallic element for promoting crystallization (typically Ni) is added, and heat treatment is performed, thus making it possible to arbitrarily determine the locations of crystal aggregates (domains). It becomes possible to suppress variations in the TFTs by arbitrarily controlling the crystal aggregate (domain) locations.

Further, it is possible to selectively locate crystal aggregate (domain) boundaries outside of the TFT formation region. The metallic element which promotes crystallization (typically Ni) possesses a spreading property with the crystal nucleation point as an origin, and therefore it is possible to reduce the concentration of the metallic element within the TFT regions within the crystalline silicon film by selectively locating the crystal aggregate (domain) boundaries on the outside of the TFT formation region.

Laser light is selectively irradiated to the amorphous silicon film in the periphery of the channel formation region or the periphery of the TFT formation region. The irradiation energy is from 0.1 to 1.0 mW/$\mu$m$^2$, and the scanning speed is from 0.1 to 1.0 m/sec. The irradiation width is between 1 and several tens of micrometers. The region irradiated is not used as the TFT formation region, and therefore it is preferable that this region be as small as possible. Note that the light used in irradiation is excimer laser light, YAG laser light, or YVO$_4$ laser light.

Further, according to the present invention, the region to be crystallized on the amorphous silicon film is limited and thus the concentration of the metallic element for promoting crystallization (typically, Ni) to be added can be reduced. This metallic element which promotes crystallization possesses a spreading property with the crystal nucleation point as an origin, but a part of the metallic element remains in the crystal aggregates (domains) and thus it is preferable to perform crystallization by adding less amount of the metallic element.

Further, metallic elements applicable to the above manufacturing method are metallic elements that promote crystallization. One element or a plurality of elements, selected from the group consisting of Fe, Ni, Co, Ru, Rh, Pd, Os, Ir, Pt, Cu, and Au is used as a suitable metallic element for promoting crystallization in the present invention.

The region selectively irradiated with laser light becomes a crystalline silicon film, and will not become a crystal nucleation point, even if the metallic element for promoting crystallization (typically Ni) is added and heat treatment is performed. It is therefore possible to generate crystal nucleation only from the channel formation region or the TFT formation region within the amorphous silicon film. Further, the size of the crystal aggregates (domains) is as large as approximately 200 to 300 $\mu$m, and therefore it is possible to form one channel formation region or one TFT formation region by one crystal aggregate (domain).

It is possible to reduce the concentration of the metallic element within the TFT regions throughout the crystalline silicon film by selectively locating the crystal aggregate (domain) boundaries outside of the TFT formation regions, but gettering may also be performed in order to additionally reduce the metallic element concentration within the TFT formation region. A method with which the amorphous silicon outside the TFT formation region is removed exists as a method of making each TFT formation region independent to the amorphous silicon films, but silicon removing regions cannot be made into portions of gettering regions in this case. However, by applying the present invention, each TFT formation region is made independent by using the crystalline silicon films, which are irradiated with the laser light provided that the present invention is used, and therefore it is also possible to use the independent regions as gettering regions. Gettering performance is high if the gettering region is large, and therefore the present invention is an additionally effective method for cases in which gettering is performed.

Note that, in the present invention, the term amorphous silicon film is not limited to the strict meaning of a complete amorphous structure and that a state containing minute crystal grains, so-called microcrystalline silicon films, and silicon films containing a localized crystalline structure are also included as amorphous silicon films. In addition, amorphous silicon germanium films, amorphous silicon carbide films, and the like can also be applied. Furthermore, the term semiconductor device indicates general devices capable of functioning by utilizing semiconductor characteristics in the present invention, and electrochemical devices, self-light emitting devices, semiconductor circuits, and electronic equipment are included as semiconductor devices.

BRIEF DESCRIPTION OF THE DRAWINGS

In the accompanying drawings:

FIGS. 4A to 4C2 are diagrams showing a process of manufacturing an active matrix display device shown in Embodiment 3;

FIGS. 5A to 5C2 are diagrams showing the process of manufacturing an active matrix display device shown in Embodiment 3;

FIGS. 6A to 6C2 are diagrams showing the process of manufacturing an active matrix display device shown in Embodiment 3;

FIGS. 7A to 7B2 are diagrams showing the process of manufacturing an active matrix display device shown in Embodiment 3;

FIGS. 8A1 and 8A2 are diagrams showing the process of manufacturing an active matrix display device shown in Embodiment 3;

FIGS. 11A to 11F are diagrams showing electronic equipment shown in Embodiment 7.

DETAILED DESCRIPTION OF THE PREFERRED EMBODIMENTS

Embodiment Mode

Figure 1A:
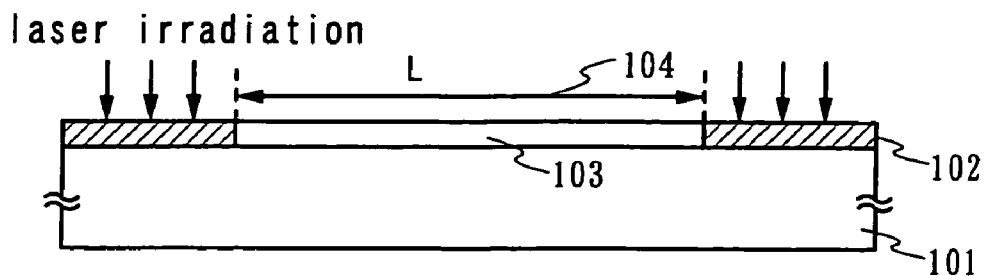
FIGS. 1A to 1E are diagrams showing a process of manufacturing a semiconductor device of the present invention shown in Embodiment 1.

An embodiment mode of the present invention is explained in detail with reference to the accompanying drawings. In the present invention, as a first stage, a crystalline semiconductor film 102 is selectively formed by selectively irradiating light to an amorphous semiconductor film. An amorphous semiconductor film 103 is a region to which light is not irradiated. The length L of the non-irradiated region is dependent on a region in which TFTs are formed, and the size of crystal aggregates (domains) is from 200 to 300 µm, and therefore the length L may be L≦200 µm. Note that reference numeral 101 denotes an insulating substrate. (See FIG. 1A).

Figure 3:
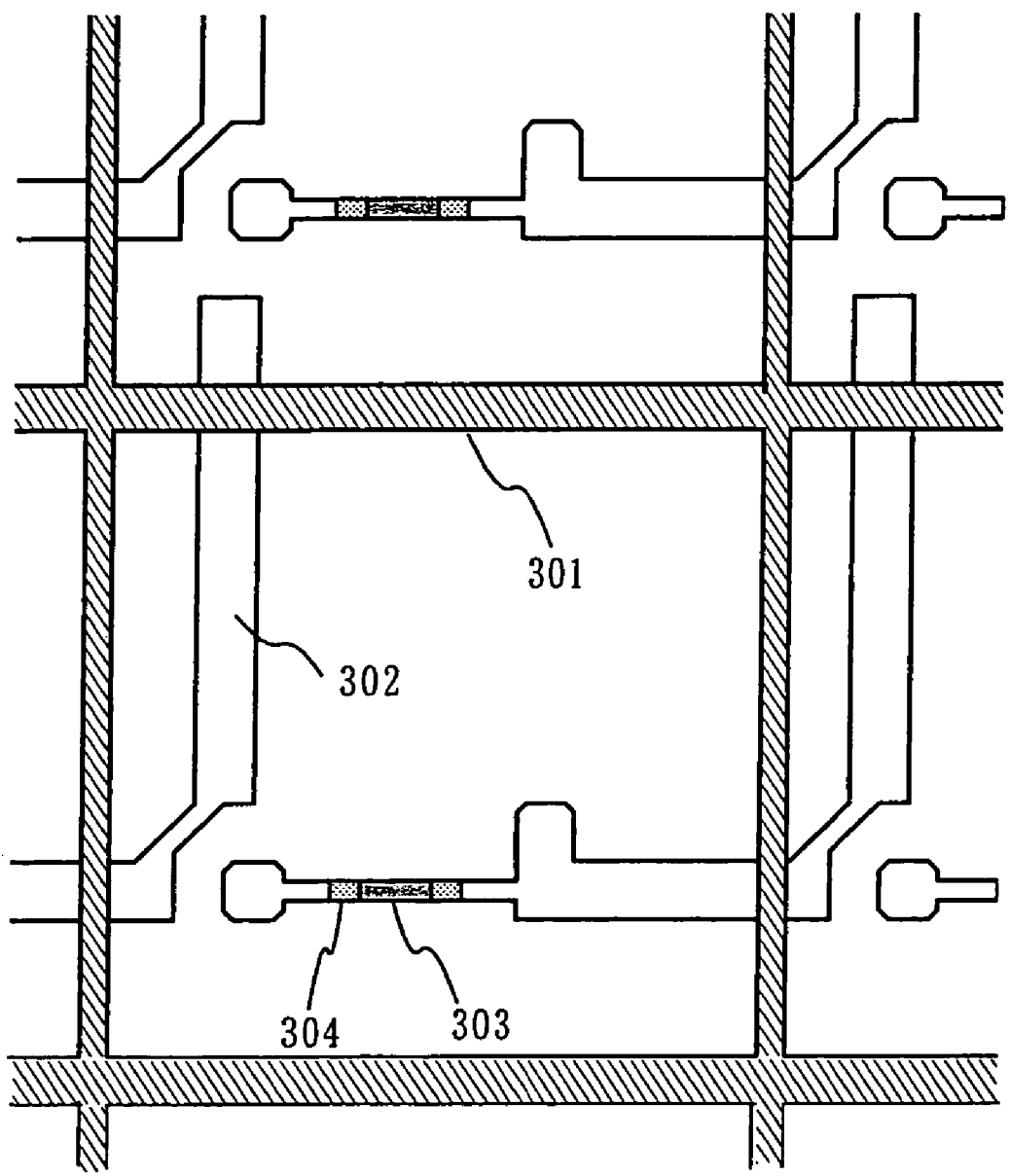
FIG. 3 is a diagram for explaining a laser irradiation region in a process of manufacturing a semiconductor device of the present invention.

Irradiation may be performed such that laser light is irradiated to a region such as a region 301 of FIG. 3, which does not include a TFT formation region 302, a channel formation region 303, and an LDD forming region 304, and irradiation may also be performed to regions only excluding the channel formation region 303 and the LDD forming region 304. (See FIGS. 2A to 2G).

Figure 1B:
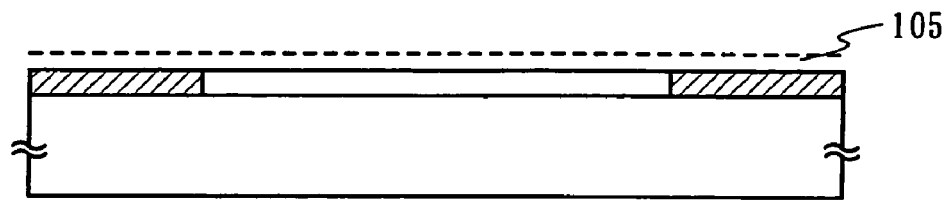

After cleaning the surfaces of the semiconductor films 102 and 103 using hydrofluoric acid, an oxide film (not shown) is formed thereon by using aqueous ozone. A metallic element is added next, forming a thin metallic film 105. (See FIG. 1B).

Figure 1C:
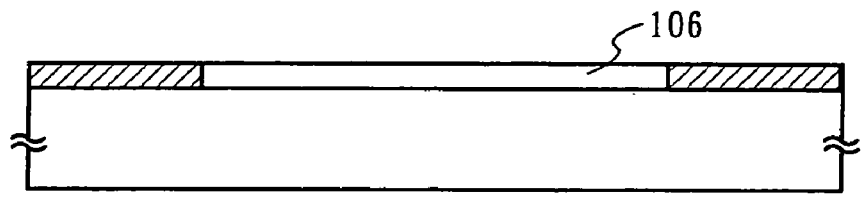
Figure 1D:
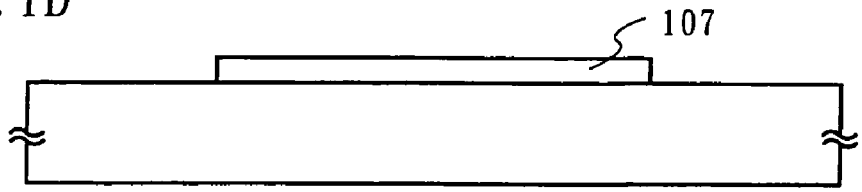
Figure 1E:
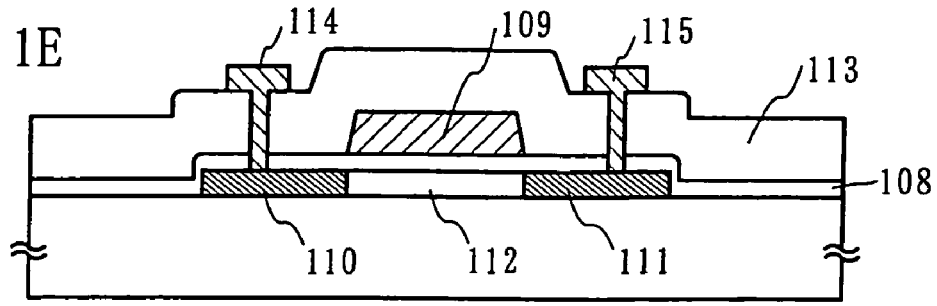
Figure 2A:
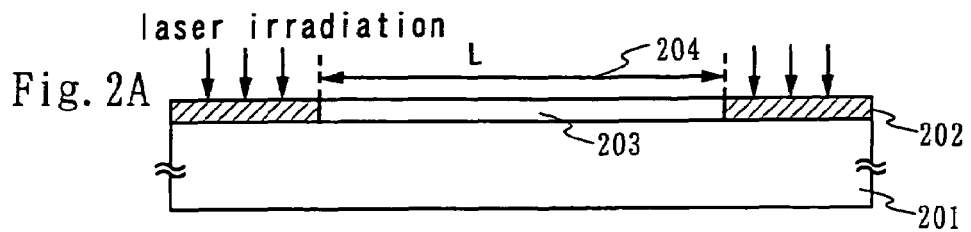
FIGS. 2A to 2G are diagrams showing a process of manufacturing a semiconductor device of the present invention shown in Embodiment 2.
Figure 2B:
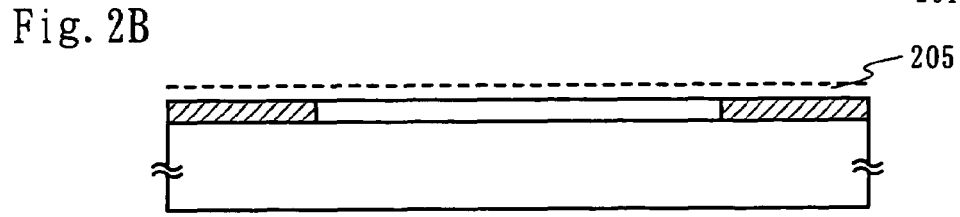
Figure 2C:
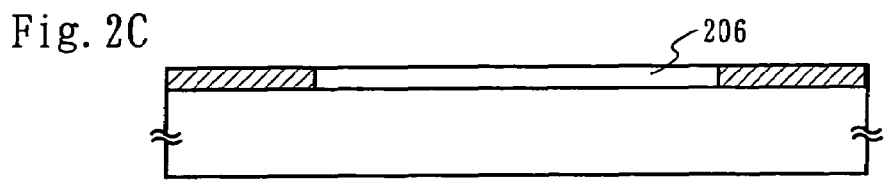
Figure 2D:
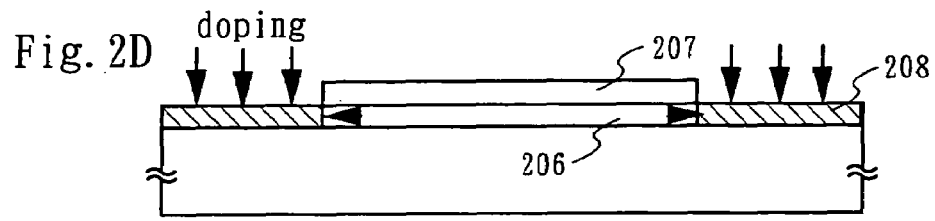
Figure 2E:
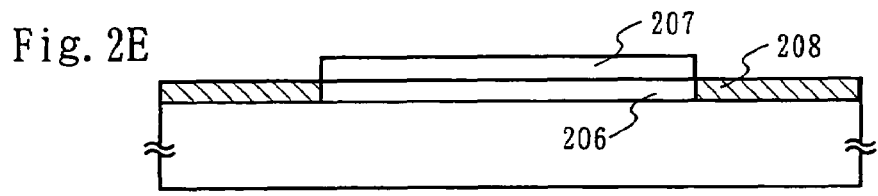
Figure 2F:
Figure 2G:
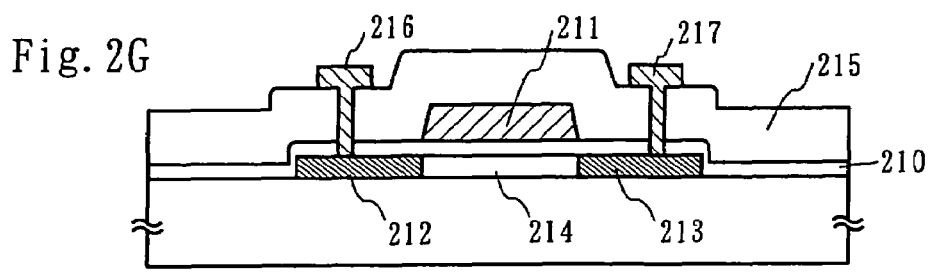

Heat treatment is then performed, causing crystallization to form a crystalline semiconductor film 106. (See FIG. 1C).

The crystalline semiconductor film 106 obtained is patterned to form a semiconductor layer 107. Patterning may also be performed so that the laser irradiated region 301 of FIG. 3 is not included. It is possible to lower the concentration of the metallic element within the TFT formation region 302, the channel formation region 303, and the LDD forming region 304 by not including the laser irradiated region 301. The laser irradiated region 301 may include the TFT formation region 302, provided that the channel formation region 303 and the LDD forming region 304 are not included. In accordance with the aforementioned technique, the TFT formation region or the channel formation region can thus be formed by only a crystal aggregate (domain).

Note that, for the amorphous semiconductor film, it is possible to use semiconductor materials obtained by reduced pressure CVD, plasma CVD, sputtering, or the like, for example silicon or an alloy of silicon and germanium ($Si_xGe_{1-x}$, where x is from 0.0001 to 0.02).

Further, the metallic element for promoting crystal growth which is added after selectively forming crystalline silicon film by laser light may be removed from, or reduced in concentration within, the crystalline semiconductor film if necessary by performing gettering after crystallization. As a method of adding the metallic element which promotes crystal growth, a method of adding a liquid containing the metallic element may be used, and a method of forming a thin film by sputtering or CVD may also be used. As a gettering technique, a method in which an amorphous silicon film (gettering sites) having an inert gas (typically argon) is deposited on the crystalline silicon film through an oxide film, and heat treatment is performed to move the metallic element within the crystalline silicon film (typically nickel) to the gettering sites and removing it from, or reducing its concentration in, the crystalline silicon film may be used, or a method in which phosphorous or an inert gas is added to a portion of the crystalline silicon film, gettering sites are formed, and heat treatment is performed to move the metallic element (typically nickel) from regions to be gettered to the gettering sites, thus performing gettering, may also be used.

Further, each of the TFT formation regions is made independent by performing laser irradiation to form crystalline silicon films, and therefore it is also possible to use the independent regions as gettering sites. It is therefore possible to use a very wide region as a gettering region, compared to cases in which each TFT formation region is made independent by being cut into a pattern.

Further, a pulse oscillation or continuous oscillation excimer laser, the second harmonic or the third harmonic of a YAG laser, and the second harmonic of a $YVO_4$ laser can be used as the laser light. The shape of the region to which laser light is irradiated may be linear or rectangular.

A crystalline semiconductor thin film in which only crystal aggregates (domains) are within a channel formation region or a TFT formation region can be obtained in accordance with the present invention, and uniform electrical characteristics can also be obtained.

Further, it is possible to reduce the concentration of the metallic element within the TFT formation regions throughout the crystalline silicon film by selectively locating the crystal aggregate (domain) boundaries outside of the TFT formation regions.

EMBODIMENTS

Embodiment 1

Embodiment 1 relates to a technique of suppressing TFT variation by forming an amorphous semiconductor film on a quartz substrate, performing selective laser light irradiation to selectively form independent amorphous semiconductor thin films, introducing a metallic film for promoting crystallization to the amorphous semiconductor films, crystallizing the independent amorphous semiconductor thin films by using heat treatment, and as a result, arbitrarily controlling the position of crystal aggregates (domains).

A process of manufacturing a crystalline semiconductor film of Embodiment 1 is shown in FIGS. 1A to 1E. First, a 50 nm thick amorphous silicon film is formed on the quartz substrate 101 by reduced pressure thermal CVD. Laser light is then selectively irradiated to the amorphous silicon film 102. Further, the amorphous silicon film 103 not yet irradiated is later used for a TFT formation region. If L (reference numeral 104) is taken as the length of the amorphous silicon, then L≦200 µm. The second harmonic (532 nm) of a continuous oscillation YAG laser is used here. (See FIG. 1A).

A surface natural oxidation film (not shown) is cleaned next by using hydrofluoric acid, after which oxide films are formed on the surface of the amorphous silicon film 103 and the crystalline silicon film 102, which has been crystallized by laser light irradiation, by using aqueous ozone. A solution containing nickel (5 ppm) is then applied by spin coating, forming the thin metallic film 105. (See FIG. 1B).

Crystallization is performed next by heat treatment, forming the crystalline semiconductor film 106. (See FIG. 1C). Heat treatment is performed here for one hour at 450° C., and then for 12 hours at 600° C. The semiconductor film 106 having a crystalline structure thus obtained is formed by one crystal aggregate (domain).

The semiconductor film 106 is then patterned to form a semiconductor layer 107. (See FIG. 1D).

Cleaning of the surface of the semiconductor layer 107 is then performed by using an etchant containing hydrofluoric acid, after which an insulating film having silicon as its main constituent and which becomes a gate insulating film 108 is formed. It is preferable that surface cleaning and formation of the gate insulating film be performed consecutively without exposure to the atmosphere.

Next, after cleaning the surface of the gate insulating film, a gate electrode 109 is formed, and an impurity element that imparts n-type conductivity to a semiconductor (such as P or As), in this case phosphorous, is suitably added, forming a source region 110 and a drain region 111. After the addition of the impurity element for activating the impurity element, heat treatment, exposure to strong light, or laser light irradiation is performed. Further, plasma damage to the gate insulating film and plasma damage to the interface between the gate insulating film and the semiconductor layer can be recovered simultaneously with activation.

Subsequent steps include forming an interlayer insulating film 113, performing hydrogenation, forming contact holes that reach the source region and the drain region, and forming a source electrode 114 and a drain electrode 115, thus completing the TFT. (See FIG. 1E).

TFTs thus obtained have only crystal aggregates (domains) in their channel formation region 112 with no grain boundaries, and the variations in the TFTs formed on the substrate is small.

Further, the present invention is not limited to the structure of FIGS. 1A to 1E. A structure in which a low concentration drain (LDD: lightly doped drain) having an LDD region between the channel formation region and the drain region (or the source region) may also be used when necessary. This structure is one in which a region having a low concentration of an impurity element is formed between the channel formation region and the source region or the drain region, which have a high concentration of an impurity element. This region is referred to as an LDD region. In addition, a GOLD (gate-drain overlapped LDD) structure in which the LDD region is disposed overlapping with the gate electrode through the gate insulating film may also be used.

Furthermore, although an n-channel TFT is used here for the explanation, a p-channel TFT in which a p-type impurity element is used as a substitute for the n-type impurity element can of course also be used.

In addition, although an example of a top gate TFT is explained here, it is possible to apply the present invention regardless of the TFT structure. For example, it is possible to apply the present invention to bottom gate (reverse stagger) TFTs and forward stagger TFTs.

Embodiment 2

Embodiment 2 relates to a technique of suppressing TFT variation by introducing a metallic film for promoting crystallization to an amorphous semiconductor film, crystallizing independent amorphous semiconductor thin films by heat treatment, performing gettering processing in order to remove a metallic element from, or reduce the concentration of the metallic element in, the crystallized semiconductor films, and as a result, arbitrarily controlling the location of crystal aggregates (domains).

A process of manufacturing a crystalline semiconductor film of Embodiment 2 is shown in FIGS. 2A to 2G. First, a 50 nm thick amorphous silicon film is formed on the quartz substrate 201 by reduced pressure thermal CVD. Laser light is then selectively irradiated to the amorphous silicon film 202. Further, the amorphous silicon film 203 not yet irradiated is later used for a TFT formation region. If L (reference numeral 204) is taken as the length of the amorphous silicon, then L≦200 µm. The second harmonic (532 nm) of a continuous oscillation YAG laser is used here. (See FIG. 2A).

A surface natural oxidation film (not shown) is cleaned next by using hydrofluoric acid, after which oxide films are formed on the surface of the amorphous silicon film 203 and the crystalline silicon film 202, which has been crystallized by laser light irradiation, by using aqueous ozone. A solution containing nickel (5 ppm) is then applied by spin coating, forming the thin metallic film 205. (See FIG. 2B).

Crystallization is performed next by heat treatment, forming the semiconductor film 206 having a crystalline structure. (See FIG. 2C). Heat treatment is performed here for one hour at 450° C., and then for 12 hours at 600° C. The semiconductor film 206 having a crystalline structure thus obtained is formed by one crystal aggregate (domain).

A silicon oxide film having a thickness of 200 nm is formed next by reduced pressure thermal CVD. Patterning is performed, forming a mask silicon oxide film 207, and argon is doped. (See FIG. 2D).

Heat treatment is performed next, segregating nickel from the region 206 serving as an active layer for a TFT and into a gettering region 208. Heat treatment is performed here at 600° C. for 12 hours. (See FIG. 2E).

The mask silicon oxide film is then removed, and patterning is performed, thus forming a semiconductor film 209. (See FIG. 1F).

Cleaning of the surface of the semiconductor layer 209 is then performed by using an etchant containing hydrofluoric acid, after which an insulating film having silicon as its main constituent and which becomes a gate insulating film 210 is formed. It is preferable that surface cleaning and formation of the gate insulating film be performed consecutively without exposure to the atmosphere.

Next, after cleaning the surface of the gate insulating film, a gate electrode 211 is formed, and an impurity element that imparts n-type conductivity to a semiconductor (such as P or As), in this case phosphorous, is suitably added, forming a source region 212 and a drain region 213. After the addition of the impurity element for activating the impurity element, heat treatment, exposure to strong light, or laser light irradiation is performed. Further, plasma damage to the gate insulating film and plasma damage to the interface between the gate insulating film and the semiconductor layer can be recovered simultaneously with activation.

Subsequent steps include forming an interlayer insulating film 215, performing hydrogenation, forming contact holes in the source region and the drain region, and forming a source electrode 216 and a drain electrode 217, thus completing the TFT. (See FIG. 2G).

TFTs thus obtained have only crystal aggregates (domains) in their channel formation region 214 with no grain boundaries, and the variations in the TFTs formed on the substrate is small.

Further, the present invention is not limited to the structure of FIGS. 2A to 2G. A structure in which a low concentration drain (LDD: lightly doped drain) having an LDD region between the channel formation region and the drain region (or the source region) may also be used when necessary. This structure is one in which a region having a low concentration of an impurity element is formed between the channel formation region and the source region or the drain region, which have a high concentration of an impurity element. This region is referred to as an LDD region. In addition, a GOLD (gate-drain overlapped LDD) structure in which the LDD region is disposed overlapping with the gate electrode through the gate insulating film may also be used.

Furthermore, although an n-channel TFT is used here for the explanation, a p-channel TFT in which a p-type impurity element is used as a substitute for the n-type impurity element can of course also be used.

In addition, although an example of a top gate TFT is explained here, it is possible to apply the present invention regardless of the TFT structure. For example, it is possible to apply the present invention to bottom gate (reverse stagger) TFTs and forward stagger TFTs.

Embodiment 3

Described here is a method of manufacturing a liquid crystal display device using an active matrix substrate which has a pixel portion. The description will be given with reference to FIGS. 4A to 8A2.

An active matrix liquid crystal display device that uses a TFT as a switching element has a substrate on which pixel electrodes are arranged so as to form a matrix (active matrix substrate) and an opposite substrate on which an opposite electrode is formed. The active matrix substrate and the opposite substrate face each other via a liquid crystal layer. The distance between the substrates is kept constant by a spacer or the like. A liquid crystal layer is sealed between the substrates by a seal member placed on the outer periphery of the pixel portion.

An example of manufacturing active matrix substrate is given below.

Figure 4A:
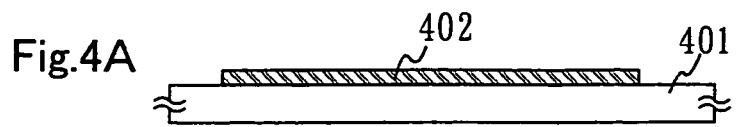

First, a conductive film is formed on a substrate 401 which has an insulating surface and is patterned to form a scanning line 402 (FIG. 4A). The scanning line 402 also functions as a light-shielding layer for protecting an active layer to be formed later from light. Here, a quartz substrate is used for the substrate 401 and the scanning line 402 is a laminate of a polysilicon film (75 nm in thickness) and a tungsten silicide (W—Si) film (150 nm in thickness). The polysilicon film is used to improve the heatproof of a tungsten silicide.

Figure 4B:
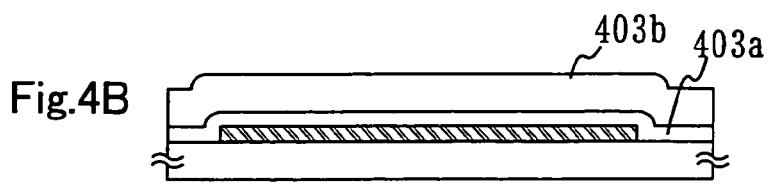

Next, insulating films 403a and 403b are formed to have a thickness of 100 to 1000 nm (typically 300 to 600 nm) to cover the scanning line 402 (FIG. 4B). Here, a silicon oxide film formed by CVD to have a thickness of 100 nm and a silicon oxide film formed by LPCVD to have a thickness of 480 nm are laminated.

After the insulating film 403b is formed, the surface of the insulating film may be leveled by chemical-mechanical polishing process (typically CMP technique) and the like. For example, the insulating film is polished so that the insulating film is equal to or lower than 0.5 μm at the height point (Rmax), preferably, equal to or lower than 0.3 μm.

Next, an amorphous semiconductor film is formed to have a thickness of 10 to 100 nm. Here, reduced pressure thermal CVD is used to form an amorphous silicon film with a thickness of 50 nm. In reduced pressure thermal CVD, a film is formed on each side of a substrate. Therefore, after a resist film is formed on the front side of the substrate, the amorphous silicon film on the back side is removed by a mixture gas of $SF_6$ and He. After the films on the back side are removed, the resist film is removed and the silicon oxide film is removed.

The amorphous semiconductor film is then crystallized. In Embodiment 3, the amorphous silicon film is selectively irradiated with the laser light (the continuous oscillation YAG laser, 0.1 mW/μm$^2$, scan speed 0.5 m/sec). Then, the entire surface of the amorphous silicon film is doped with a metal element that accelerates crystallization and performed the heat treatment, a crystalline silicon film can be obtained thereby a TFT formation region can be formed in one crystalline collection (domain). Here, after an oxide film is formed on the surface of the amorphous silicon film by the solution containing the ozone, the solution containing the nickel with 5 ppm is spread by using the nickel as a metal element that accelerates crystallization.

Next, heat treatment (at 450° C. for an hour) for dehydrogenation is followed by heat treatment (at 600° C. for twelve hours) for crystallization. A crystalline silicon film can be obtained thereby a crystalline silicon film can be obtained thereby a TFT formation region can be formed in one crystalline collection (domain). A gettering step may be interposed here to remove Ni from a region that serves as an active layer of a TFT. In this case, the region for serving as the active layer of a TFT is covered with a mask (silicon oxide film), a part of the crystalline silicon film is doped with phosphorus (P) or argon (Ar), and the heat treatment (at 600° C. for twelve hours in a nitrogen atmosphere) is performed.

Next, unnecessary portions of the silicon film with a crystal structure are removed by patterning to form a semiconductor layer 404 (FIG. 4C1). A top view of the pixel after the semiconductor layer 404 is formed is shown in FIG. 4C2. A sectional view taken along the dotted line A-A' in FIG. 4C2 corresponds to FIG. 4C1.

Next, the oxide silicon film 405 that becomes a gate insulating film is formed with 30 nm by the LPCVD, and then the mask 406 is formed to form a storage capacitor. (FIG. 5A)

Next, the oxide silicon film 405 on the region 407 forming a storage capacitor is removed. The region 407 that becomes a storage capacitor is doped with phosphorus. (FIG. 5B)

Next, the mask 406 is removed and an oxide silicon film that becomes a gate insulating film is formed with 50 nm by the LPCVD. The final thickness of the gate insulating film 408a becomes 80 nm. An insulating film 408b formed on the region that serves as the storage capacitor is thinner than the insulating film on the other regions (FIG. 5C1). A top view of the pixel at this point is shown in FIG. 5C2. A sectional view taken along the dotted line B-B' in FIG. 5C2 corresponds to FIG. 5C1. A region indicated by the dot-dash line in FIG. 5C2 is the region on which the thin insulating film 408b is formed.

The next step is channel doping in which a region that serves as a channel region of a TFT is entirely or selectively doped with a low concentration of p-type or n-type impurity element. The channel doping step is a step for controlling the threshold voltage of the TFT. Here, boron is doped by ion doping in which diborane ($B_2H_6$) is subjected to plasma excitation without mass separation. Ion implantation involving mass separation may be employed instead.

A mask 409 is formed on the insulating film 408a and 408b to form a contact hole that reaches the scanning line 402 (FIG. 6A). After the contact hole is formed, the mask is removed.

A conductive film is then formed and patterned to form a gate electrode 410 and a capacitance wiring line 411 (FIG. 6B). Used here is a laminated structure of a silicon film (150 nm in thickness) doped with phosphorus and a tungsten silicide film (150 nm in thickness). The storage capacitor is constituted of the capacitance wiring line 411 and the region 407 of the semiconductor layer with the insulating film 408b as dielectric.

Next, using the gate electrode 410 and the capacitance wiring line 411 as masks, the semiconductor layer is doped with a low concentration of phosphorus in a self-aligning manner (FIG. 6C1). A top view of the pixel at this point is shown in FIG. 6C2. A sectional view taken along the dotted line C-C' in FIG. 6C2 corresponds to FIG. 6C1. The concentration of the phosphorus concentration is adjusted so as to reach $1 \times 10^{16}$ to $5 \times 10^{18}$ atoms/cm$^3$, typically, $3 \times 10^{17}$ to $3 \times 10^{18}$ atoms/cm$^3$.

A mask 412 is formed and the semiconductor layer is doped with a high concentration of phosphorus to form a high concentration impurity region 413 that serves as a source region or a drain region (FIG. 7A). The concentration of the phosphorus in the high concentration impurity region is adjusted so as to reach $1 \times 10^{20}$ to $1 \times 10^{21}$ atoms/cm$^3$ (typically, $2 \times 10^{20}$ to $5 \times 10^{20}$ atoms/cm$^3$). Of the semiconductor layer 404, a region that overlaps the gate electrode 410 serves as a channel formation region 414 and a region covered with the mask 412 forms a low concentration impurity region 415 to function as an LDD region. After doping of the impurity element is finished, the mask 412 is removed.

Though not shown in the drawings, a region for forming an n-channel TFT is covered with a mask and the semiconductor layer is doped with boron to form a source region or drain region for a p-channel TFT of a driving circuit formed on the same substrate on which pixels are formed.

After the mask 412 is removed, a passivation film 416 is formed to cover the gate electrode 410 and the capacitance wiring line 411. The passivation film prevents oxidization of the gate electrode and functions as an etching stopper in a later leveling step. A silicon oxide film with a thickness of 70 nm is used here for the passivation film. The next step is heat treatment for activating the n-type and p-type impurity elements used to dope the semiconductor layer in different concentrations. Heat treatment here is conducted at 950° C. for 30 minutes.

An interlayer insulating film 417 is formed next from an organic resin material or a silicon material. A silicon oxynitride film with a thickness of 1 μm is used here, and is leveled by etch back. Contact holes to reach the semiconductor layer are formed to form an electrode 418 and a source wiring line 419. In Embodiment 3, the electrode 418 and the source wiring line 419 are a laminate of three layers that are formed in succession by sputtering. The three layers are a Ti film with a thickness of 100 nm, an aluminum film containing Ti with a thickness of 300 nm, and a Ti film with a thickness of 150 nm (FIG. 7B1). A sectional view taken along the dotted line D-D' in FIG. 7B2 corresponds to FIG. 7B1.

After performing hydrogenation treatment, a lamination of a silicon oxynitride film (500 nm in thickness) and a BCB film (1 μm and 300 nm in thickness) is formed as an interlayer insulating film 420 (FIG. 8A1). A conductive film (100 nm in thickness) that is capable of shielding against light is formed on the interlayer insulating film 420, and patterned to form a light-shielding layer 421. A silicon oxynitride film with a thickness of 150 nm is formed next as an interlayer insulating film 422. Then, a contact hole to reach the electrode 418 is formed. A transparent conductive film (here, an indium tin oxide, ITO, film) with a thickness of 100 nm is formed and then patterned to form pixel electrodes 423 and 424. A sectional view taken along the dotted line E-E' in FIG. 8A2 corresponds to FIG. 8A1.

In this way, a pixel TFT that is an n-channel TFT and a storage capacitor with enough capacitance (51.5 fF) are formed in the pixel portion while a sufficient area (aperture ratio: 76.5%) is secured for a display region (pixel size: 26 μm×26 μm).

This embodiment is merely an example and the present invention is not limited to the process of this embodiment. For example, the conductive films in this embodiment may be formed of an element selected from the group consisting of tantalum (Ta), titanium (Ti), molybdenum (Mo), tungsten (W), chromium (Cr), and silicon (Si), or of an alloy containing a combination of the elements listed above (typically a Mo—W alloy or a Mo—Ta alloy). A silicon oxide film, a silicon nitride film, a silicon oxynitride film, or an organic resin material (such as polyimide, acrylic, polyamide, polyimideamide, BCB (benzocyclobutene)) film can be used for the insulating films of this embodiment.

In Embodiment 3, a transparent conductive film is used for a pixel electrode to manufacture an active matrix substrate for a transmissive display device. However, it is also possible to manufacture an active matrix substrate for a reflective display device if a pixel electrode is formed from a reflective material.

Embodiment 4

The description in Embodiment 3 takes as an example a top gate TFT. The present invention is also applicable to a bottom gate TFT shown in FIGS. 9A and 9B.

Figure 9A:
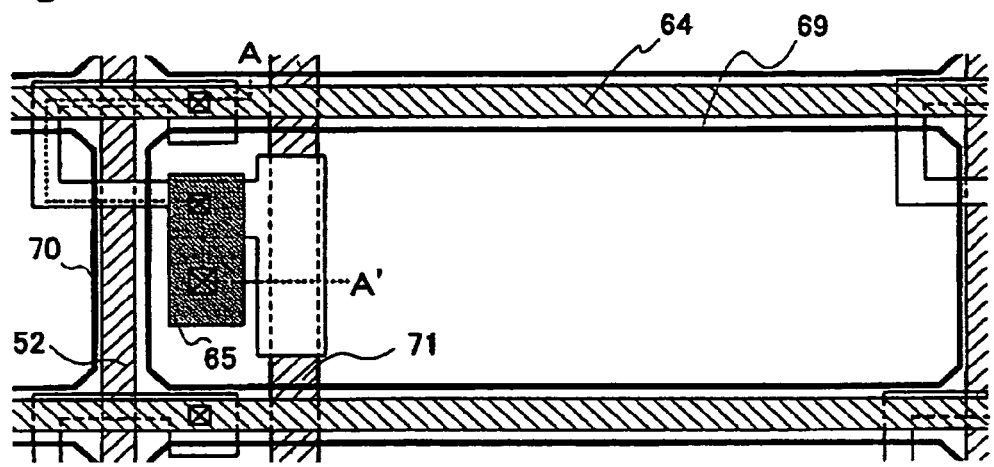
FIGS. 9A and 9B are diagrams showing a process of manufacturing an active matrix display device shown in Embodiment 4.

FIG. 9A is an enlarged top view of one of pixels in a pixel portion. A section taken along the dotted line A-A' in FIG. 9A corresponds to the sectional structure of the pixel portion in FIG. 9B.

Figure 9B:
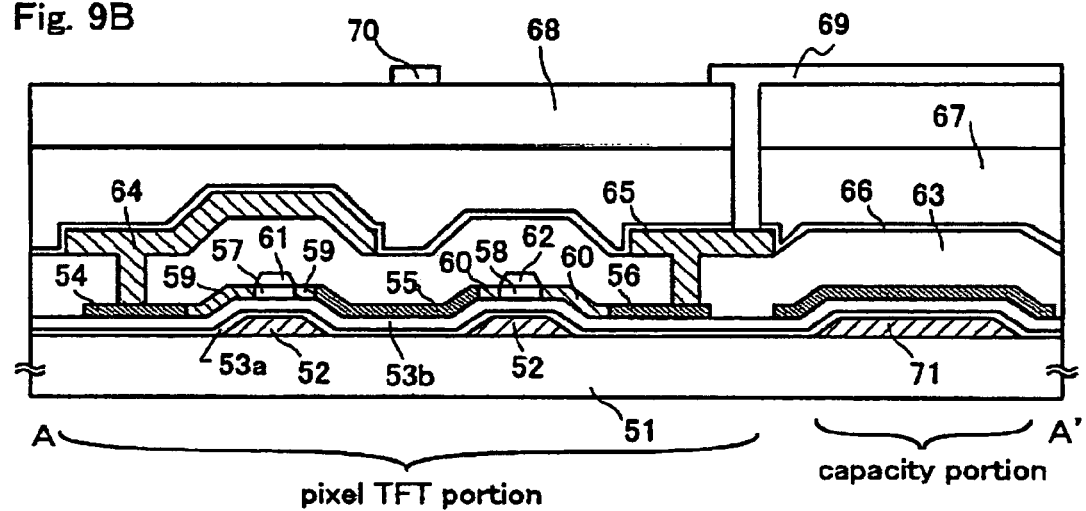

In the pixel portion shown in FIGS. 9A and 9B, n-channel TFTs constitute the pixel TFT portion. A gate electrode 52 is formed on a substrate 51. A first insulating film 53a is formed on the gate electrode from silicon nitride and a second insulating film 53b is formed on the first insulating film from silicon oxide. An active layer is formed on the second insulating film. The active layer is composed of source and drain regions 54 to 56, channel formation regions 57 and 58, and LDD regions 59 and 60. Each LDD region is placed between one channel formation region and one source or drain region. The channel formation regions 57 and 58 are protected by insulating layers 61 and 62, respectively. Contact holes are formed in a first interlayer insulating film 63 that covers the insulating layers 61 and 62 and the active layer. A wiring line 64 is formed to be connected to the source region 54 and a wiring line 65 is formed to be connected to the drain region 56. A passivation film 66 is formed on the wiring lines. A second interlayer insulating film 67 is formed on the passivation film. A third interlayer insulating film 68 is formed on the second interlayer insulating film. A pixel electrode 69 is formed from a transparent conductive film such as an ITO film or a SnO$_2$ film and is connected to the wiring line 65. Denoted by 70 is a pixel electrode adjacent to the pixel electrode 69.

In this embodiment, the active layer is formed in accordance with Embodiment Mode. First, the gate electrode 52 is formed on the substrate 51. The first insulating film 53a is formed on the gate electrode from silicon nitride and the second insulating film 53b is formed on the first insulating film from silicon oxide. Then, an amorphous silicon film is formed. Next, the amorphous silicon film is selectively irradiated with laser light (CW YAG laser, 0.1 mW to 1.0 mW, scan speed 0.5 m/sec.). Then, the entire surface of the amorphous silicon film is doped with a metal element that accelerates crystallization and performed the heat treatment, a crystalline silicon film can be obtained thereby a TFT formation region can be formed in one crystalline collection (domain). Nickel is then removed or reduced by gettering. The crystalline silicon film is patterned to form the active layer.

Although a bottom gate TFT of channel stop type is described as an example in this embodiment, the present invention is not particularly limited thereto.

The gate wiring line of the pixel TFT in the pixel portion of this embodiment is arranged so as to form a double gate structure. However, the present invention may take a triple gate structure or other multi-gate structure in order to reduce fluctuation in OFF current. A single gate structure may also be employed in order to improve the aperture ratio.

A capacitor portion of the pixel portion is composed of a capacitance wiring line 71 and the drain region 56 with the first insulating film and the second insulating film as dielectric.

The pixel portion shown in FIGS. 9A and 9B is merely an example and the present invention is not particularly limited to the above structure.

Embodiment 5

Embodiment 5 describes a process of manufacturing an active matrix liquid crystal display device from the active matrix substrate fabricated in Embodiment 3. The description is given with reference to FIG. 10.

After the active matrix substrate as illustrated in FIG. 8 is obtained in accordance with Embodiment 3, an orientation film is formed on the active matrix substrate of FIG. 8 and subjected to rubbing treatment. In this embodiment, an organic resin film such as an acrylic resin film is patterned to form columnar spacers in desired positions in order to keep the distance between the substrates before the orientation film is formed. The columnar spacers may be replaced by spherical spacers sprayed onto the entire surface of the substrate.

An opposite substrate is prepared next. The opposite substrate has a color filter in which colored layers and light-shielding layers are arranged with respect to the respective pixels. A light-shielding layer is also placed in the driving circuit portion. A leveled film is formed to cover the color filter and the light-shielding layer. On the leveled film, an opposite electrode is formed from a transparent conductive film in the pixel portion. An orientation film is formed over the entire surface of the opposite substrate and is subjected to rubbing treatment.

Then the opposite substrate is bonded to the active matrix substrate on which the pixel portion and the driving circuits are formed, through a sealing member. The sealing member has filler mixed therein and the filler, together with the columnar spacers, keeps the distance between the two substrates while they are bonded. Thereafter a liquid crystal material is injected between the substrates and an encapsulant (not shown) is used to completely seal the substrates. A known liquid crystal material can be used for a liquid crystal material. The active matrix liquid crystal display device is thus completed. If necessary, the active matrix substrate or the opposite substrate is cut into pieces with desired shapes. The display device may be appropriately provided with a polarizing plate using a known technique. Then FPCs are attached using a known technique.

Figure 10:
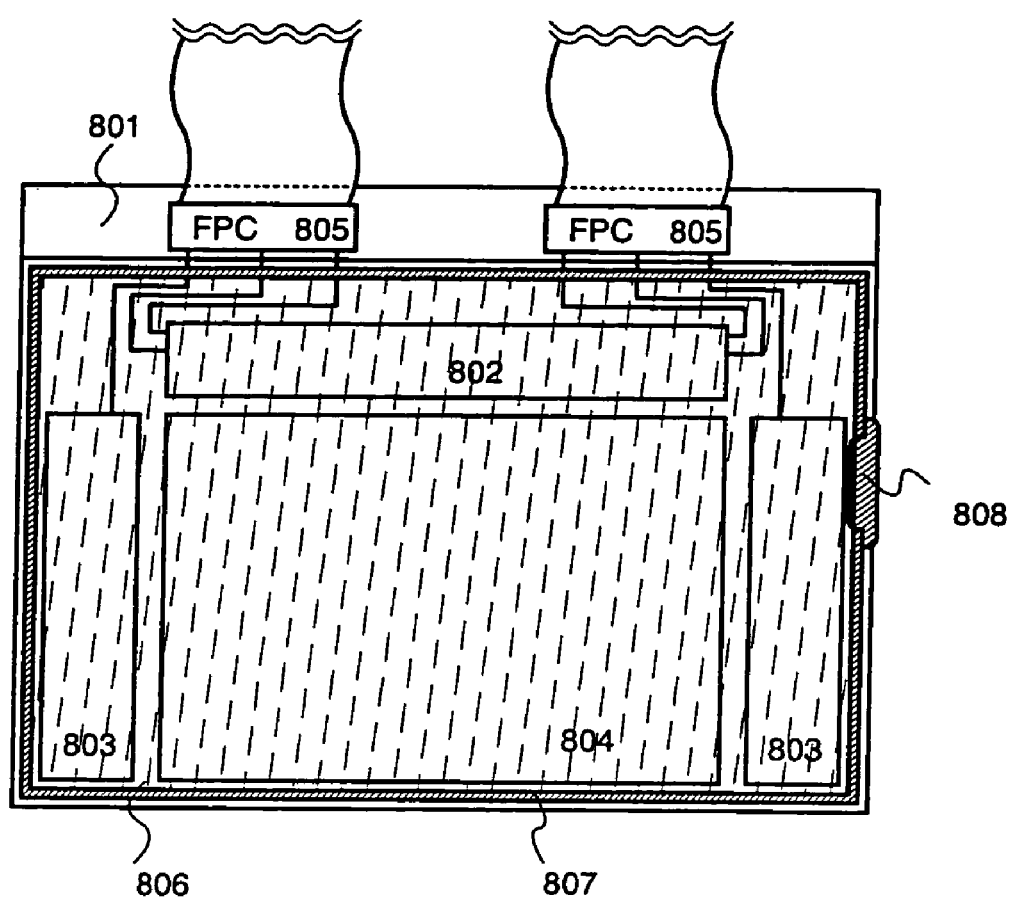
FIG. 10 is a diagram showing a liquid crystal module shown in Embodiment 5.

The structure of the thus obtained liquid crystal module is described with reference to the top view in FIG. 10.

A pixel portion 804 is placed in the center of an active matrix substrate 801. In FIG. 10, a source signal line driving circuit 802 for driving source signal lines is positioned above the pixel portion 804. Gate signal line driving circuits 803 for driving gate signal lines are placed at the left and right sides of the pixel portion 804. Although the gate signal line driving circuits 803 are symmetrical with respect to the pixel portion in this embodiment, the liquid crystal module may have only one gate signal line driving circuit at one side of the pixel portion. A designer can choose the arrangement that suits better considering the substrate size of the liquid crystal module, or the like. However, the symmetrical arrangement of the gate signal line driving circuits shown in FIG. 10 is preferred in terms of circuit operation reliability, driving efficiency, and the like.

Signals are inputted to the driving circuits from flexible printed circuits (FPC) 805. The FPCs 805 are press-fit through an anisotropic conductive film or the like after opening contact holes in the interlayer insulating film and resin film and forming a connection electrode so as to reach the wiring lines arranged in given places of the substrate 801. The connection electrode is formed from ITO in this embodiment.

A sealing agent 807 is applied to the substrate to surround the driving circuits and the pixel portion. An opposite substrate 806 is bonded to the substrate 801 through the sealing agent 807 while a spacer formed in advance on the active matrix substrate keeps the gap between the two substrates (the substrate 801 and the opposite substrate 806) constant. A liquid crystal element is injected through an area of the substrate that is not coated with the sealing agent 807. The substrates are then sealed by an encapsulant 808. The liquid crystal module is completed through the above steps.

Although all of the driving circuits are formed on the substrate here, several ICs may be used for some of the driving circuits.

In addition, this embodiment can be applied to the active matrix substrate obtained in Embodiment 4 substituted for that obtained in Embodiment 3.

Embodiment 6

This embodiment shows an example of manufacturing a light emitting display device, which has an EL (Electro Luminescence) element.

A pixel portion, a source side driving circuit, and a gate side driving circuit are formed on a substrate with an insulating surface (for example, a glass substrate, a crystallized glass substrate, a plastic substrate, and the like). The pixel portion and the driving circuits can be obtained in accordance with the description in Embodiment 1 or Embodiment 2. The pixel portion and the driving circuits are covered with a seal member, which in turn is covered with a protective film. Further, sealing is completed by a cover member with an adhesive. The cover member is desirably formed from the same material as the substrate, for example, a glass substrate, in order to prevent deformation due to heat and external force. The cover member is processed by sand blasting or the like to have a concave shape (depth: 3 to 10 μm). Desirably, the cover member is further processed to have a dent (depth: 50 to 200 μm) in which a drying agent is placed. If more than one EL modules are to be obtained from one sheet, $CO_2$ laser or the like is used to cut out a module with its ends flush after bonding the cover member to the substrate.

Described next is the sectional structure of the device. An insulating film is formed on a substrate. A pixel portion and a gate side driving circuit are formed on the insulating film. The pixel portion is composed of a plurality of pixels each including a current controlling TFT and a pixel electrode that is electrically connected to a drain of the current controlling TFT. The gate side driving circuit is built from a CMOS circuit in which an n-channel TFT and a p-channel TFT are combined. These TFTs can be manufactured in accordance with Embodiment 1 or Embodiment 2.

The pixel electrode functions as an anode of an EL element. A bank is formed on each end of the pixel electrode. An EL layer and cathode of the EL element are formed on the pixel electrode.

The EL layer (a layer which emits light and in which carriers moves for light emission) is a combination of a light emitting layer, an electric charge transporting layer, and an electric charge injecting layer. For example, a low molecular weight organic EL material or a high molecular weight organic EL material is used for the EL layer. A thin film of a light emitting material (singlet compound) that emits light from singlet excitation (fluorescence), or a thin film of a light emitting material (triplet compound) that emits light from triplet excitation (phosphorescence) may be used in the EL layer. An inorganic material such as silicon carbide may be used for the electric charge transporting layers and electric charge injecting layers. These organic EL materials and inorganic materials can be known materials.

The cathode also functions as a common wiring line to all the pixels and is electrically connected to an FPC through a connection wiring line. All the elements included in the pixel portion and gate side driving circuit are covered with the cathode, the seal member, and the protective film.

The seal member is preferably formed from a transparent or translucent material with respect to visible light. It is also desirable to use for the seal member a material that transmits as little moisture and oxygen as possible.

After the light emitting element is completely covered with the seal member, the protective film formed of a DLC film or the like is placed at least on the surface (the exposed surface) of the seal member. The protective film may cover all the surfaces including the back side of the substrate. However, it is important to avoid forming the protective film in a portion where an external input terminal (FPC) is to be placed. In order to avoid forming the protective film in this portion, a mask may be used or the external input terminal portion may be covered with a tape such as Teflon (registered trade mark) that is used as a masking tape in CVD apparatus.

By sealing as above using the seal member and the protective film, the EL element is completely shut off from the outside and external substances such as moisture and oxygen, that accelerates degradation by oxidization of EL layer, are prevented from entering the element. Accordingly, a light emitting device with high reliability can be obtained.

The light emitting device can emit light in the reverse direction to the above structure if the pixel electrode serves as a cathode and an EL layer and an anode are layered on the cathode.

Embodiment 7

The TFT fabricated by implementing the present invention can be utilized for various modules (active matrix liquid crystal module, active matrix EL module and active matrix EC module). Namely, all of the electronic apparatuses are completed by implementing the present invention.

Following can be given as such electronic apparatuses: video cameras; digital cameras; head mounted displays (goggle type displays); car navigation systems; projectors; car stereo; personal computers; portable information terminals (mobile computers, cell phones or electronic books etc.) etc. Examples of these are shown in FIGS. 11A to 11F and 12A to 12D.

FIG. 11A is a personal computer which comprises: a main body 2001; an image input section 2002; a display section 2003; a keyboard 2004 and the like. The present invention is applicable to the display section 2003.

FIG. 11B is a video camera which comprises: a main body 2101; a display section 2102; a voice input section 2103; operation switches 2104; a battery 2105; an image receiving section 2106 and the like. The present invention is applicable to the display section 2102.

FIG. 11C is a mobile computer which comprises: a main body 2201; a camera section 2202; an image receiving section 2203; operation switches 2204; a display section 2205 and the like. The present invention is applicable to the display section 2205.

FIG. 11D is a goggle type display which comprises: a main body 2301; a display section 2302; an arm section 2303 and the like. The present invention is applicable to the display section 2302.

FIG. 11E is a player using a recording medium which records a program (hereinafter referred to as a recording medium) which comprises: a main body 2401; a display section 2402; a speaker section 2403; a recording medium 2404; operation switches 2405 and the like. This apparatus uses DVD (Digital Versatile Disc), CD, etc. for the recording medium, and can perform music appreciation, film appreciation, games and use for Internet. The present invention is applicable to the display section 2402.

FIG. 11F is a digital camera which comprises: a main body 2501; a display section 2502; a view finder 2503; operation switches 2504; an image receiving section (not shown in the figure) and the like. The present invention is applicable to the display section 2502.

Figure 12A:
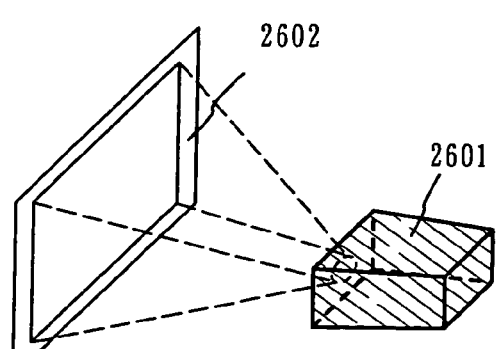
FIGS. 12A to 12D are diagrams showing electronic equipment shown in Embodiment 7.

FIG. 12A is a front type projector which comprises: a projection system 2601; a screen 2602 and the like. The present invention is applicable to the liquid crystal module 2808 forming a part of the projection system 2601.

Figure 12B:
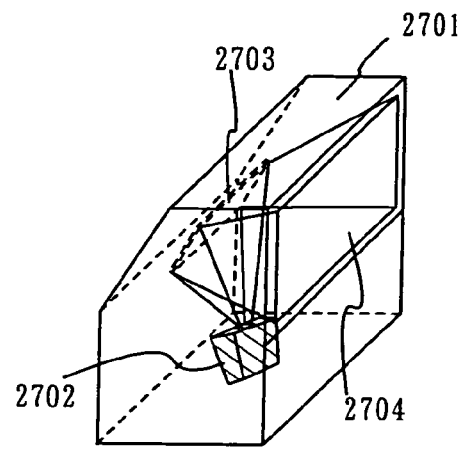

FIG. 12B is a rear type projector which comprises: a main body 2701; a projection system 2702; a mirror 2703; a screen 2704 and the like. The present invention is applicable to the liquid crystal module 2808 forming a part of the projection system 2702.

Figure 12C:
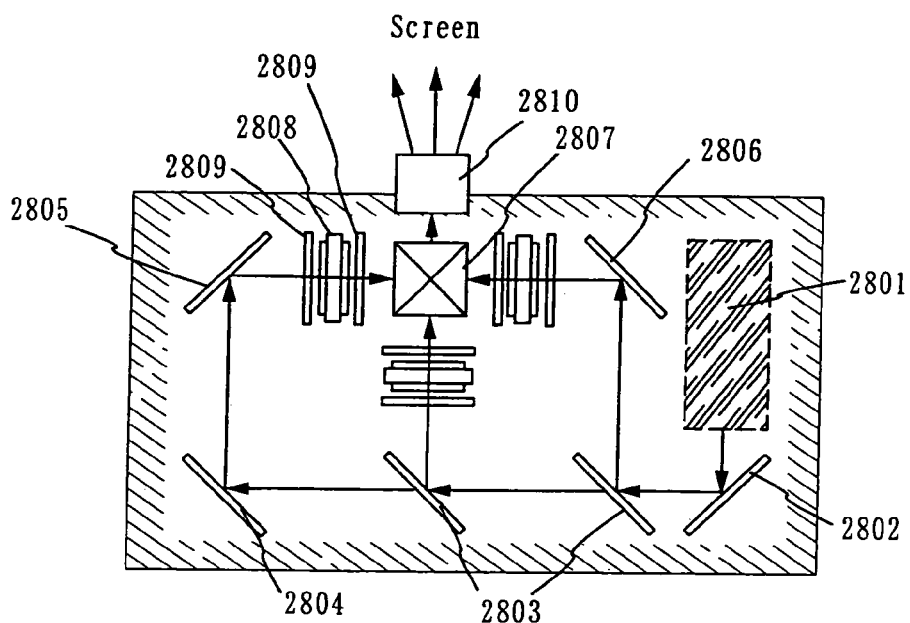

FIG. 12C is a diagram which shows an example of the structure of a projection system 2601 and 2702 in FIGS. 12A and 12B, respectively. Each of projection systems 2601 and 2702 comprises: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though this embodiment shows an example of 3-plate type, this is not to limit to this embodiment and a single plate type may be used for instance. Further, an operator may appropriately dispose an optical lens, a film which has a function to polarize light, a film which adjusts a phase difference or an IR film, etc. in the optical path shown by an arrow in FIG. 12C.

Figure 12D:
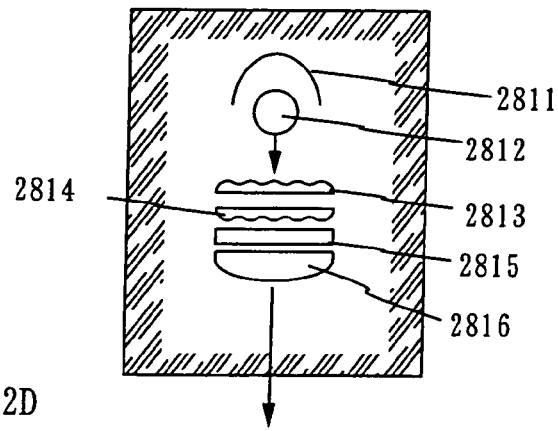
Figure 13:
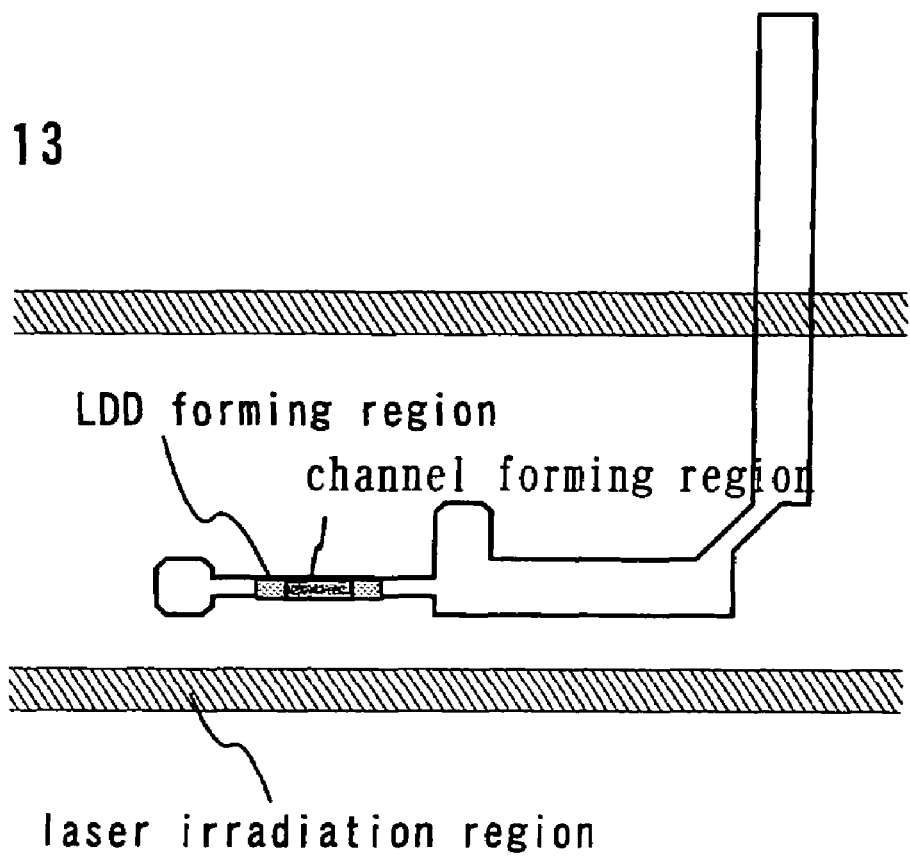
FIG. 13 is a diagram for explaining a laser irradiation region.

FIG. 12D is a diagram showing an example of a structure of an optical light source system 2801 in FIG. 12C. In this embodiment, the optical light source system 2801 comprises: a reflector 2811; a light source 2812; lens arrays 2813 and 2814; a polarizer conversion element 2815; and a collimator lens 2816. Note that the optical light source system shown in FIG. 12D is merely an example and the structure is not limited to this example. For instance, an operator may appropriately dispose an optical lens, a film which has a function to polarize light, a film which adjusts a phase difference or an IR film, etc.

Note that the projectors shown FIGS. 12A to 12D are the cases of using a transmission type electro-optical device, and applicable examples of a reflection type electro-optical device and an EL module are not shown.

As described above, the applicable range of the present invention is very large, and the invention can be applied to the manufacturing method of electronic apparatuses of various areas. Note that the electronic devices of this embodiment can be achieved by combining with any one of the structures selected from Embodiment Mode or Embodiments 1 to 6.

A channel formation region or a TFT formation region can be formed by one crystal aggregate (domain), and a semiconductor device having extremely little dispersion can be obtained in accordance with the present invention.

What is claimed is:

1. A method of manufacturing a semiconductor device comprising:
   forming an amorphous semiconductor film over a substrate;
   selectively irradiating a beam to the amorphous semiconductor film to form at least a first crystallized region and a second crystallized region wherein the first crystallized region and the second crystallized region are formed with a first amorphous region interposed therebetween;
   heating the first crystallized region, the second crystallized region and the first amorphous region, thus crystallizing the first amorphous region to form a third crystallized region;
   removing the first crystallized region and the second crystallized region and patterning the third crystallized region into a semiconductor island,
   wherein the semiconductor island includes at least a channel formation region in the third crystallized region.

2. The method according to claim 1 wherein said beam is a laser beam.

3. The method according to claim 1 further comprising a step of forming a metal containing material over at least the first amorphous region after forming the first crystallized region and the second crystallized region.

4. A method of manufacturing a semiconductor device comprising:
   forming an amorphous semiconductor film over a substrate;
   selectively irradiating a beam to the amorphous semiconductor film to form at least a first crystallized region and a second crystallized region wherein the first crystallized region and the second crystallized region are formed with a first amorphous region having a length of 200 μm or less interposed therebetween;
   heating the first crystallized region, the second crystallized region and the first amorphous region, thus crystallizing the first amorphous region to form a third crystallized region;
   removing the first crystallized region and the second crystallized region and patterning the third crystallized region into a semiconductor island,
   wherein the semiconductor island includes at least a channel formation region in the third crystallized region.

5. The method according to claim 4 wherein said beam is a laser beam.

6. The method according to claim 4 further comprising a step of forming a metal containing material over at least the first amorphous region after forming the first crystallized region and the second crystallized region.

7. A method of manufacturing a semiconductor device comprising:
   forming an amorphous semiconductor film over a substrate;
   selectively irradiating a beam to the amorphous semiconductor film to form at least a first crystallized region and a second crystallized region wherein the first crystallized region and the second crystallized region are formed with a first amorphous region interposed therebetween;
   heating the first crystallized region, the second crystallized region and the first amorphous region, thus crystallizing the first amorphous region to form a third crystallized region having a crystalline structure formed by one crystal aggregate which has a size from 200 to 300 μm;
   removing the first crystallized region and the second crystallized region and patterning the third crystallized region into a semiconductor island,
   wherein the semiconductor island includes at least a channel formation region in the third crystallized region.

8. The method according to claim 7 wherein said beam is a laser beam.

9. The method according to claim 7 further comprising a step of forming a metal containing material over at least the first amorphous region after forming the first crystallized region and the second crystallized region.

10. A method of manufacturing a semiconductor device comprising:
    forming an amorphous semiconductor film over a substrate;
    selectively irradiating a beam to the amorphous semiconductor film to form at least a first crystallized region and a second crystallized region wherein the first crystallized region and the second crystallized region are formed with a first amorphous region interposed therebetween;
    heating the first crystallized region, the second crystallized region and the first amorphous region, thus crystallizing the first amorphous region to form a third crystallized region;
    removing the first crystallized region and the second crystallized region and patterning the third crystallized region into a semiconductor island,
    wherein the semiconductor island includes at least a channel formation region in the third crystallized region, and
    wherein the channel formation region which has no grain boundaries.

11. The method according to claim 10 wherein said beam is a laser beam.

12. The method according to claim 10 further comprising a step of forming a metal containing material over at least the first amorphous region after forming the first crystallized region and the second crystallized region.

13. The method according to claim 3, wherein the metal is nickel.

14. The method according to claim 3, wherein the metal is segregated from the third crystallized region to the first crystallized region and the second crystallized region by gettering.

15. The method according to claim 1, wherein the semiconductor island further includes a source region and a drain region in the third crystallized region.

16. The method according to claim 1, wherein the semiconductor island is formed in at least one of a driving circuit portion and a pixel portion of a display device.

17. The method according to claim 6, wherein the metal is nickel.

18. The method according to claim 6, wherein the metal is segregated from the third crystallized region to the first crystallized region and the second crystallized region by gettering.

19. The method according to claim 4, wherein the semiconductor island further includes a source region and a drain region in the third crystallized region.

20. The method according to claim 4, wherein the semiconductor island is formed in at least one of a driving circuit portion and a pixel portion of a display device.

21. The method according to claim 9, wherein the metal is nickel.

22. The method according to claim 9, wherein the metal is segregated from the third crystallized region to the first crystallized region and the second crystallized region by gettering.

23. The method according to claim 7, wherein the semiconductor island further includes a source region and a drain region in the third crystallized region.

24. The method according to claim 7, wherein the semiconductor island is formed in at least one of a driving circuit portion and a pixel portion of a display device.

25. The method according to claim 12, wherein the metal is nickel.

26. The method according to claim 12, wherein the metal is segregated from the third crystallized region to the first crystallized region and the second crystallized region by gettering.

27. The method according to claim 10, wherein the semiconductor island further includes a source region and a drain region in the third crystallized region.

28. The method according to claim 10, wherein the semiconductor island is formed in at least one of a driving circuit portion and a pixel portion of a display device.

* * * * *